United States Patent
Dorf et al.

(10) Patent No.: US 10,555,412 B2
(45) Date of Patent: Feb. 4, 2020

(54) METHOD OF CONTROLLING ION ENERGY DISTRIBUTION USING A PULSE GENERATOR WITH A CURRENT-RETURN OUTPUT STAGE

(71) Applicant: Applied Materials, Inc., Santa Clara, CA (US)

(72) Inventors: Leonid Dorf, San Jose, CA (US); Olivier Luere, Sunnyvale, CA (US); Rajinder Dhindsa, Pleasanton, CA (US); James Rogers, Los Gatos, CA (US); Sunil Srinivasan, Milpitas, CA (US); Anurag Kumar Mishra, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/976,728

(22) Filed: May 10, 2018

(65) Prior Publication Data
US 2019/0350072 A1 Nov. 14, 2019

(51) Int. Cl.
| | |
|---|---|
| *H01J 37/32* | (2006.01) |
| *H05H 1/46* | (2006.01) |
| *H01J 37/34* | (2006.01) |
| *H01J 37/08* | (2006.01) |
| *C23C 14/34* | (2006.01) |
| *C23C 14/54* | (2006.01) |

(52) U.S. Cl.
CPC ............ *H05H 1/46* (2013.01); *C23C 14/345* (2013.01); *C23C 14/3485* (2013.01); *C23C 14/54* (2013.01); *H01J 37/08* (2013.01); *H01J 37/32174* (2013.01); *H01J 37/3426* (2013.01); *H01J 37/3438* (2013.01); *H01J 37/3444* (2013.01); *H01J 37/3467* (2013.01); *H05H 2001/4682* (2013.01)

(58) Field of Classification Search
CPC ............. H01J 37/32082; H01J 37/3211; H01J 37/32165; H01J 37/32174; H01J 37/32183; H01J 37/32715
USPC ..................................................... 315/111.21
See application file for complete search history.

(56) References Cited

U.S. PATENT DOCUMENTS

| | | |
|---|---|---|
| 4,070,589 A | 1/1978 | Martinkovic |
| 4,340,462 A | 7/1982 | Koch |
| 4,504,895 A | 3/1985 | Steigerwald |
| 4,992,919 A | 2/1991 | Lee et al. |
| 5,140,510 A | 8/1992 | Myers |

(Continued)

FOREIGN PATENT DOCUMENTS

WO        2015073921 A8        5/2016

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

(Continued)

*Primary Examiner* — Tung X Le
(74) *Attorney, Agent, or Firm* — Patterson + Sheridan LLP

(57) ABSTRACT

Embodiments of this disclosure describe an electrode biasing scheme that enables maintaining a nearly constant sheath voltage and thus creating a mono-energetic IEDF at the surface of the substrate that consequently enables a precise control over the shape of IEDF and the profile of the features formed in the surface of the substrate.

32 Claims, 10 Drawing Sheets

(56) References Cited

U.S. PATENT DOCUMENTS

| | | |
|---|---|---|
| 5,451,846 A | 9/1995 | Peterson et al. |
| 5,610,452 A | 3/1997 | Shimer et al. |
| 5,770,023 A | 6/1998 | Sellers |
| 5,796,598 A | 8/1998 | Nowak et al. |
| 5,810,982 A * | 9/1998 | Sellers ............... C23C 14/0036 204/192.12 |
| 6,051,114 A | 4/2000 | Yao et al. |
| 6,099,697 A | 8/2000 | Hausmann |
| 6,187,685 B1 | 2/2001 | Hopkins et al. |
| 6,201,208 B1 | 3/2001 | Wendt et al. |
| 6,253,704 B1 | 7/2001 | Savas |
| 6,392,187 B1 | 5/2002 | Johnson |
| 6,483,731 B1 | 11/2002 | Isurin et al. |
| 6,863,020 B2 | 3/2005 | Mitrovic et al. |
| 6,947,300 B2 | 9/2005 | Pai et al. |
| 7,126,808 B2 | 10/2006 | Koo et al. |
| 7,601,246 B2 | 10/2009 | Kim et al. |
| 7,718,538 B2 | 5/2010 | Kim et al. |
| 7,888,240 B2 | 2/2011 | Hamamjy et al. |
| 8,129,653 B2 | 3/2012 | Kirchmeier et al. |
| 8,382,999 B2 | 2/2013 | Agarwal et al. |
| 8,383,001 B2 | 2/2013 | Mochiki et al. |
| 8,422,193 B2 | 4/2013 | Tao et al. |
| 8,603,293 B2 | 12/2013 | Koshiishi et al. |
| 8,828,883 B2 | 9/2014 | Rueger |
| 8,845,810 B2 | 9/2014 | Hwang |
| 8,916,056 B2 | 12/2014 | Koo et al. |
| 8,926,850 B2 | 1/2015 | Singh et al. |
| 8,963,377 B2 | 2/2015 | Ziemba et al. |
| 9,039,871 B2 | 5/2015 | Nauman et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,129,776 B2 | 9/2015 | Finley et al. |
| 9,150,960 B2 | 10/2015 | Nauman et al. |
| 9,208,992 B2 | 12/2015 | Brouk et al. |
| 9,210,790 B2 | 12/2015 | Hoffman et al. |
| 9,224,579 B2 | 12/2015 | Finley et al. |
| 9,226,380 B2 | 12/2015 | Finley |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,362,089 B2 | 6/2016 | Brouk et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,520,269 B2 | 12/2016 | Finley et al. |
| 9,558,917 B2 | 1/2017 | Finley et al. |
| 9,583,357 B1 | 2/2017 | Long et al. |
| 9,601,283 B2 | 3/2017 | Ziemba et al. |
| 9,601,319 B1 | 3/2017 | Bravo et al. |
| 9,620,340 B2 | 4/2017 | Finley |
| 9,620,376 B2 | 4/2017 | Kamp et al. |
| 9,620,987 B2 | 4/2017 | Alexander et al. |
| 9,651,957 B1 | 5/2017 | Finley |
| 9,655,221 B2 | 5/2017 | Ziemba et al. |
| 9,685,297 B2 | 6/2017 | Carter et al. |
| 9,706,630 B2 | 7/2017 | Miller et al. |
| 9,728,429 B2 | 8/2017 | Ricci et al. |
| 9,761,459 B2 | 9/2017 | Long et al. |
| 9,767,988 B2 | 9/2017 | Brouk et al. |
| 9,852,889 B1 | 12/2017 | Kellogg et al. |
| 9,881,820 B2 | 1/2018 | Wong et al. |
| 9,929,004 B2 | 3/2018 | Ziemba et al. |
| 9,960,763 B2 | 5/2018 | Miller et al. |
| 10,020,800 B2 | 7/2018 | Prager et al. |
| 10,027,314 B2 | 7/2018 | Prager et al. |
| 10,224,822 B2 | 3/2019 | Miller et al. |
| 2002/0069971 A1 * | 6/2002 | Kaji ............... H01J 37/32082 156/345.46 |
| 2003/0137791 A1 | 7/2003 | Arnet et al. |
| 2004/0066601 A1 | 4/2004 | Larsen |
| 2005/0152159 A1 | 7/2005 | Isurin et al. |
| 2006/0075969 A1 | 4/2006 | Fischer |
| 2006/0158823 A1 | 7/2006 | Mizuno et al. |
| 2007/0114981 A1 | 5/2007 | Vasquez et al. |
| 2007/0196977 A1 | 8/2007 | Wang et al. |
| 2007/0285869 A1 | 12/2007 | Howald |
| 2008/0135401 A1 | 6/2008 | Kadlec et al. |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0295295 A1 * | 12/2009 | Shannon ........... H01J 37/32082 315/111.21 |
| 2010/0072172 A1 | 3/2010 | Ui et al. |
| 2010/0193491 A1 | 8/2010 | Cho et al. |
| 2010/0276273 A1 | 11/2010 | Heckman et al. |
| 2011/0259851 A1 | 10/2011 | Brouk et al. |
| 2011/0281438 A1 | 11/2011 | Lee et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0319584 A1 | 12/2012 | Brouk et al. |
| 2013/0175575 A1 | 7/2013 | Ziemba et al. |
| 2014/0062495 A1 | 3/2014 | Carter et al. |
| 2014/0077611 A1 | 3/2014 | Young et al. |
| 2014/0154819 A1 | 6/2014 | Gaff et al. |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0361690 A1 * | 12/2014 | Yamada ........... H01J 37/32091 315/111.21 |
| 2015/0043123 A1 | 2/2015 | Cox |
| 2015/0084509 A1 | 3/2015 | Yuzurihara et al. |
| 2015/0130525 A1 | 5/2015 | Miller et al. |
| 2015/0256086 A1 | 9/2015 | Miller et al. |
| 2015/0303914 A1 | 10/2015 | Ziemba et al. |
| 2015/0318846 A1 | 11/2015 | Prager et al. |
| 2015/0325413 A1 | 11/2015 | Kim et al. |
| 2016/0020072 A1 | 1/2016 | Brouk et al. |
| 2016/0056017 A1 | 2/2016 | Kim et al. |
| 2016/0241234 A1 | 8/2016 | Mavretic |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0069462 A1 | 3/2017 | Kanarik et al. |
| 2017/0076962 A1 | 3/2017 | Engelhardt |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0311431 A1 | 10/2017 | Park |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0102769 A1 | 4/2018 | Prager et al. |
| 2018/0166249 A1 | 6/2018 | Dorf et al. |
| 2018/0189524 A1 | 7/2018 | Miller et al. |

(56) References Cited

U.S. PATENT DOCUMENTS

| | | |
|---|---|---|
| 2018/0204708 A1* | 7/2018 | Tan .................... C23C 16/0245 |
| 2018/0205369 A1 | 7/2018 | Prager et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1* | 10/2018 | Wang .................... H01Q 5/335 |
| 2018/0331655 A1 | 11/2018 | Prager et al. |
| 2019/0080884 A1 | 3/2019 | Ziemba et al. |
| 2019/0096633 A1 | 3/2019 | Pankratz et al. |

OTHER PUBLICATIONS

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.

Eagle Harbor Technologies webpage—"In Situ Testing of EHT Integrators on a Tokamak," 2015, 1 page.

Eagle Harbor Technologies webpage—High Gain and Frequency Ultra-Stable Integrators for Long Pulse and/or High Current Applications, 2013, 1 page.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—"Long-Pulse Integrator Testing with DIII-D Magnetic Diagnostics," 2016, 1 page.

Sunstone Circuits—"Eagle Harbor Tech Case Study," date unknown, 4 pages.

* cited by examiner

METHOD OF CONTROLLING ION ENERGY DISTRIBUTION USING A PULSE GENERATOR WITH A CURRENT-RETURN OUTPUT STAGE

BACKGROUND

Field

Embodiments described herein generally relate to plasma processing chambers used in semiconductor manufacturing.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in an RIE processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a "power electrode", a metal baseplate embedded into the "electrostatic chuck" (ESC) assembly, more commonly referred to as the "cathode". FIG. 1A depicts a plot of a typical RF voltage to be supplied to a power electrode in a typical processing chamber. The power electrode is capacitively coupled to the plasma of a processing system through a layer of dielectric material (e.g., ceramic material), which is a part of the ESC assembly. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF). In plasmas with RF bias, the IEDF typically has two peaks, at low and high energy, and some ion population in between, as illustrated in FIG. 1B. The presence of the ion population in-between the two peaks of the IEDF is reflective of the fact that the voltage drop between the substrate and the plasma oscillates at the RF bias frequency. When a lower frequency, e.g., 2 MHz, RF bias generator is used to get higher self-bias voltages, the difference in energy between these two peaks can be significant; and because the etch profile due to the ions at low energy peak is more isotropic, this could potentially lead to bowing of the feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch.

As feature sizes continue to diminish and the aspect ratio increases, while feature profile control requirements get more stringent, it becomes more desirable to have a well-controlled Ion Energy Distribution Function (IEDF) at the substrate surface during processing. A single-peak IEDF can be used to construct any IEDF, including a two-peak IEDF with independently controlled peak heights and energies, which is beneficial for high-precision plasma processing. The authors have noticed that creating a single-peak IEDF, such as the single-peak IEDF 520 shown in FIG. 5C, requires having a nearly constant potential difference between the plasma and the substrate, i.e. a nearly constant sheath voltage, because the sheath voltage determines the ion energy at the surface of a substrate during processing. Assuming a nearly constant plasma potential (which is typically not more than a few tens of volts above ground potential in processing plasmas), this requires maintaining a nearly constant negative potential at the surface of the substrate with respect to ground. The authors have further noticed that this cannot be accomplished by simply applying a DC voltage to a power electrode. This is because in the presence of the electron-repelling plasma (cathode) sheath, the ion current from the bulk plasma is not balanced by the electron current from the bulk plasma, due to the sheath electric field repelling the electrons away from the substrate. As a result, the unbalanced net current from the bulk plasma (equal to the ion current) is constantly charging the substrate surface, which ultimately leads to all of the applied DC voltage being dropped across the substrate and a dielectric layer of the ESC assembly (i.e., chuck capacitor) instead of across the plasma sheath (i.e., sheath capacitor) as desired.

Accordingly, there is a need in the art for novel biasing methods that enable maintaining a nearly constant sheath voltage (equal to the value of the substrate voltage to ground, assuming near-zero plasma potential) and thus creating a mono-energetic IEDF at the surface of the substrate; consequently enabling a precise control over the shape of IEDF and the profile of the features formed in the surface of the substrate.

SUMMARY

Embodiments of the disclosure provided herein may include a method of processing of a substrate that enables maintaining a nearly constant sheath voltage for up to about 90% of the substrate processing time is provided. The performed method will result in a single (narrow) peak ion energy distribution function (IEDF) that can be further used to create an IEDF with an arbitrary shape. Herein, the method includes generating a plasma over a surface of a substrate disposed on a substrate support and establishing a pulsed voltage waveform at a biasing electrode disposed within the substrate support. The pulsed voltage waveform is established at the biasing electrode using a pulsed bias generator coupled to the biasing electrode by a second electrical conductor. The pulsed bias generator includes a pulse generator and a current-return output stage which are simultaneously coupled to the second electrical conductor. The pulse generator that maintains a predetermined, positive voltage across its output (i.e. to ground) during regularly recurring time intervals of a predetermined length, by repeatedly closing and opening its internal switch at a predetermined rate. The pulse generator includes a constant voltage source, a switch, and a snubber. When closed, the switch electrically couples a positive output of the substantially constant voltage source to an output of the pulse generator that is simultaneously coupled through a first electrical conductor to the second electrical conductor. The snubber, for example a "flyback" diode, across the output of the pulse generator minimizes (or "snubs") the possible voltage spikes during the rapid release of the magnetic energy by the inductive components (such as first and second electrical conductors) following the opening of the switch. Herein, a first end of the current-return output stage is electrically coupled through a first electrical conductor to a positive output of the nanosecond pulse generator and simultaneously to the second electrical conductor, and a second end of the current-return output stage is electrically coupled to ground.

In some embodiments the pulsed voltage waveform includes a plurality of pulsed voltage cycles, where each pulsed voltage cycle includes a sheath collapse phase, a chuck capacitor recharging phase, a sheath formation phase, and an ion current phase. During the collapse phase the switch is closed and a sheath capacitance is discharged by the current supplied by the pulse generator. During the chuck capacitor recharging phase the switch is maintained in the closed position and a positive charge is provided to the biasing electrode by the current from the pulse generator. During the sheath formation phase the switch is opened and the current flows from the sheath and stray capacitances to ground through the current-return output stage. During the ion current phase the switch is maintained in an open position and an ion current, likewise flowing from the plasma to ground through the current-return output stage, causes accumulation of the positive charge on the substrate surface and gradually discharges the sheath and chuck capacitors, thus slowly decreasing the sheath voltage drop.

In some embodiments, the sheath collapse phase, the recharging phase, and the sheath formation phase have a combined duration of between about 200 ns and about 300 ns. In some embodiments, a positive output voltage of the pulse generator, during the time when the switch remains closed, is between about 0.1 kV and about 10 kV. In some embodiments, the switch remains in the closed position for between about 10 ns and about 100 ns of each pulsed voltage cycle. In some embodiments, each pulsed voltage cycle has a duration of between about 2 µs and about 3 µs. In some embodiments, the combined sheath collapse phase and recharging phase comprise less than about 10% of the pulsed voltage cycle. In some embodiments, the biasing electrode is spaced apart from a substrate supporting surface of the substrate support by a layer of the dielectric material, and wherein a combined series capacitance of the layer of the dielectric material of the substrate support and the substrate disposed thereon is between about 5 nF and about 12 nF. In some embodiments, a chucking power supply is coupled to the external electrical conductor at a connection point, and wherein a blocking capacitor, having a capacitance of between about 40 nF and about 80 nF, is disposed in series with the pulsed bias generator between the pulsed bias generator and the connection point. In some embodiments, a blocking resistor, having a resistance more than about 1 MOhm, is disposed between the chucking power supply and the connection point.

In another embodiment, a processing chamber includes a chamber lid, one or more sidewalls, and a chamber base which together define a processing volume. The processing chamber further includes a substrate support disposed in the processing volume, where the substrate support includes a biasing electrode that is separated from a substrate supporting surface of the substrate support by a dielectric material layer, and a pulsed bias generator coupled to the biasing electrode by a second electrical conductor. The pulsed bias generator includes a pulse generator and a current return stage. The pulse generator includes, a voltage source, a switch that, when closed, electrically couples a positive output of the voltage source to an output of the pulse generator, where the output of the pulse generator is coupled through a first electrical conductor to the second electrical conductor, and a snubber across the output of the pulse generator. The voltage source may be a constant voltage source. Herein, a first end of the current-return output stage is simultaneously electrically coupled to the second electrical conductor and through a first electrical conductor to a positive output of the pulse generator and a second end of the current-return output stage is electrically coupled to the ground. In some embodiments, the processing chamber includes an inductively coupled plasma (ICP) or capacitively coupled plasma (CCP) plasma generator.

Embodiments of the present disclosure may further include a processing chamber, comprising a substrate support comprising a biasing electrode that is separated from a substrate supporting surface of the substrate support by a dielectric material layer, and a bias generator that is coupled to the biasing electrode by an electrical conductor. The bias generator includes a pulse generator, comprising a voltage source having a positive terminal and a negative terminal, wherein the negative terminal is coupled to ground, a switch that, when closed, electrically connects the positive terminal to an end of the electrical conductor; and a snubber connected between the end of the electrical conductor and the ground. The bias generator also includes a current-return output stage, wherein a first end of the current-return output stage is electrically coupled to the electrical conductor, and a second end of the current-return output stage is electrically coupled to the ground. The electrical conductor may further include a first electrical conductor and a second electrical conductor that are connected in series, wherein one end of the first electrical conductor is connected to the positive terminal of the voltage source and one end of the second electrical conductor is connected to the biasing electrode. In some configurations, the first electrical conductor is an "internal" electrical conductor found within the bias generator, and the second electrical conductor is an "external" electrical conductor disposed between the bias generator and the biasing electrode.

Embodiments of the present disclosure may further include a method of processing of a substrate, comprising generating a plasma over a surface of a substrate disposed on a substrate support, and biasing a biasing electrode disposed within the substrate support using a bias generator that is coupled to the biasing electrode by an electrical conductor. The bias generator includes a pulse generator, comprising a voltage source having a positive terminal and a negative terminal, wherein the negative terminal is coupled to ground, and a switch that, when closed, electrically connects the positive terminal to the electrical conductor; and a current-return output stage, wherein a first end of the current-return output stage is electrically coupled to the electrical conductor, and a second end of the current-return output stage is electrically coupled to the ground. The method of biasing the biasing electrode comprises generating a pulsed voltage waveform at the biasing electrode by repetitively closing the switch for a first period of time and then opening the switch for a second period of time a plurality of times, wherein closing the switch causes a positive voltage relative to the ground to be applied to the electrical conductor by the voltage source during the first period of time, and opening the switch causes a current flow from the biasing electrode to ground through the current-return output stage during at least a portion of the second period of time. The method may also include substantially eliminating a sheath voltage drop formed over the surface of the substrate, by the generated plasma, by the end of the first period of time, and causing a current to flow from the biasing electrode to ground through the current-return output stage during the second period of time. The method may also include forming a plasma potential, and the first period of time comprises a sheath collapse phase having a first time duration, wherein at the end of the first time duration a potential formed on the surface of the substrate substantially equals the plasma potential of the generated plasma, and a chuck capacitance recharging phase having a second time duration, wherein a sheath voltage drop formed over the surface of the substrate by the generated plasma is eliminated after the first time duration and the second time duration have been sequentially completed. The second period of time may comprise a sheath formation phase having a third time duration, wherein the current flow from the biasing electrode to ground through the current-return output stage occurs during the third time duration, and an ion current phase having a fourth time duration, wherein the fourth time duration is longer than the first, second and third time durations combined.

Embodiments of the present disclosure further include a processing chamber that includes a substrate support that includes a biasing electrode that is separated from a substrate supporting surface of the substrate support by a dielectric material layer, and a bias generator that is coupled to the biasing electrode by an electrical conductor. The bias generator comprises a pulse generator, comprising a voltage source having a positive terminal and a negative terminal, wherein the negative terminal is coupled to ground, and a switch that, when closed, electrically connects the positive terminal to an end of the electrical conductor. The bias generator also comprises a current-return output stage, wherein a first end of the current-return output stage is electrically coupled to the electrical conductor, and a second end of the current-return output stage is electrically coupled to the ground. The processing chamber also includes a computer readable medium having instructions stored thereon for performing a method of processing a substrate when executed by a processor, the method comprising generating a plasma over a surface of a substrate disposed on the substrate support, and biasing the biasing electrode using the bias generator, wherein biasing the biasing electrode comprises generating a pulsed voltage waveform at the biasing electrode by repetitively closing the switch for a first period of time and then opening the switch for a second period of time a plurality of times, and wherein closing the switch causes a positive voltage relative to the ground to be applied to the end of the electrical conductor during the first period of time, and opening the switch causes a current flow from the biasing electrode to ground through the current-return output stage during at least a portion of the second period of time. The electrical conductor may further include a first electrical conductor and a second electrical conductor that are connected in series, wherein one end of the first electrical conductor is connected to the positive terminal of the voltage source and one end of the second electrical conductor is connected to the biasing electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein are applicable to all plasma assisted or plasma enhanced processing chambers and methods of plasma assisted or plasma enhanced processing of a substrate. More specifically, embodiments of this disclosure describe an electrode biasing scheme that enables maintaining a nearly constant sheath voltage and thus creating a mono-energetic IEDF at the surface of the substrate; consequently enabling a precise control over the shape of IEDF and the profile of the features formed in the surface of the substrate. The following definitions are used throughout this disclosure: (1) unless a reference is specified, all potentials are referenced to ground; (2) the voltage at any physical point (like a substrate or a biasing electrode) is likewise defined as the potential of this point with respect to ground (zero potential point); (3) the cathode sheath is implied to be an electron-repelling, ion-accelerating sheath that corresponds to a negative substrate potential with respect to plasma; (4) the sheath voltage (also referred to sometimes as "sheath voltage drop"), $V_{sh}$, is defined as the absolute value of the potential difference between the plasma and the adjacent surface (e.g. of the substrate or the chamber wall); and (5) the substrate potential is the potential at the substrate surface facing the plasma.

We propose a pulsed voltage biasing scheme (such as the biasing scheme described in relation to FIGS. 2 and 3), in which a pulsed bias generator (such as a pulsed bias generator 240 in FIG. 2) is used to establish a pulsed voltage waveform (such as the pulsed voltage waveform 500 shown in FIG. 5A) at a biasing electrode (such as the chucking pole 204) that is separated from the substrate by a thin layer of a dielectric material within the ESC assembly (this thin layer forms ESC capacitor, $C_{ESC}$). This pulsed voltage biasing scheme enables maintaining a nearly constant sheath voltage for up to about 90% of the substrate processing time, which results in a single (narrow) peak IEDF (such as IEDF 520 in FIG. 5C) that can be further used to create an IEDF with an arbitrary shape.

We note the possibility of using other biasing schemes for establishing a pulsed voltage waveform such as the waveform 500 (illustrated in FIG. 5A) at a biasing electrode (such as the chucking pole) that is separated from the substrate by a thin layer of a dielectric material within the ESC assembly. Therefore, we separately propose (without specifying a biasing scheme) that establishing a pulsed voltage waveform such as the waveform 500 at the said biasing electrode enables maintaining a nearly constant sheath voltage for up to about 90% of the substrate plasma processing time, which results in a single (narrow) peak IEDF that can be used to create an IEDF with the arbitrary shape.

Figure 2:
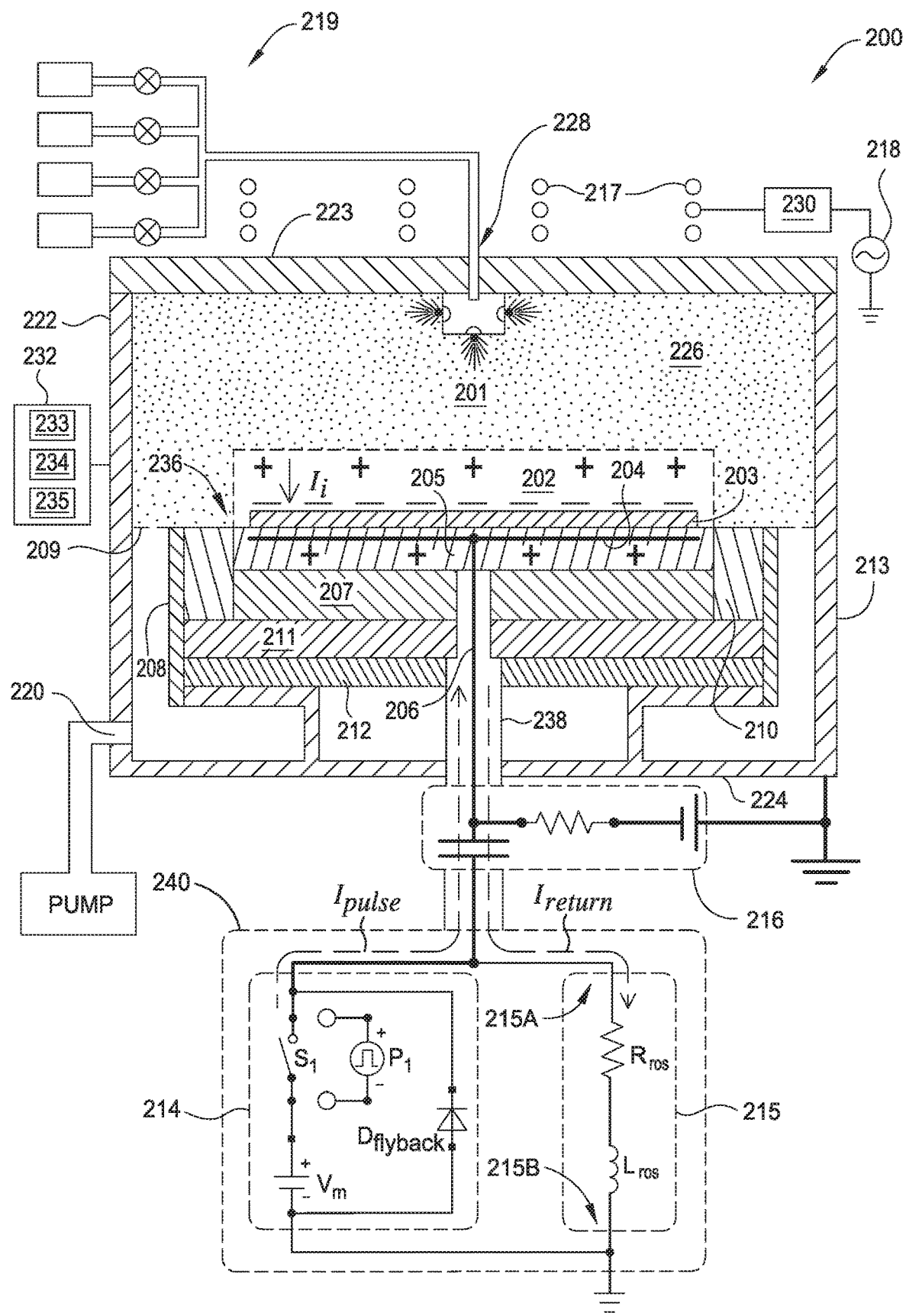
FIG. 2 is a schematic cross-sectional view of an example processing chamber configured to practice methods described herein, according to one embodiment.
Figure 3:
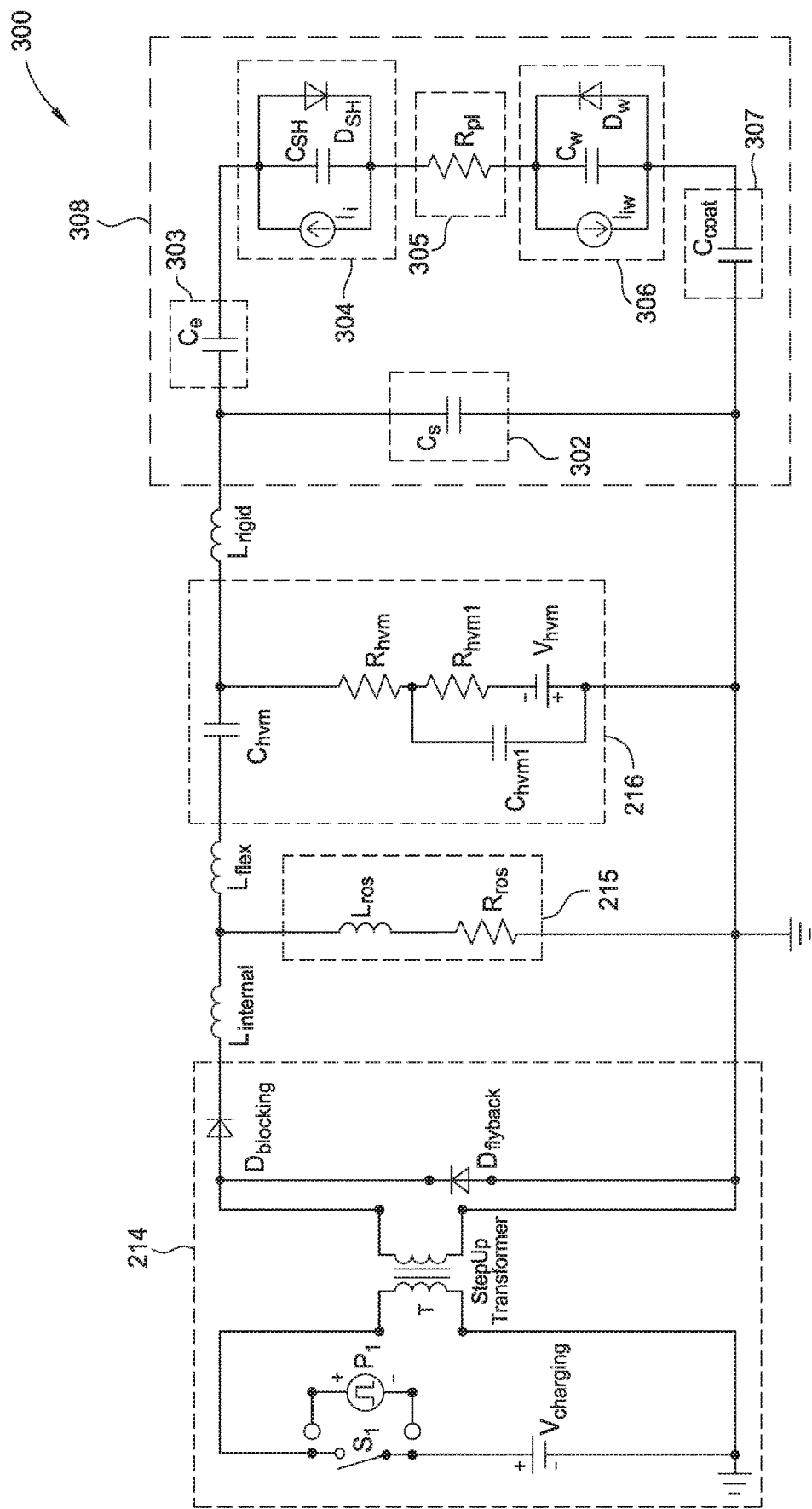
FIG. 3 is a functionally equivalent approximate circuit diagram of the pulsed voltage biasing scheme described herein, according to one embodiment.
Figure 6:
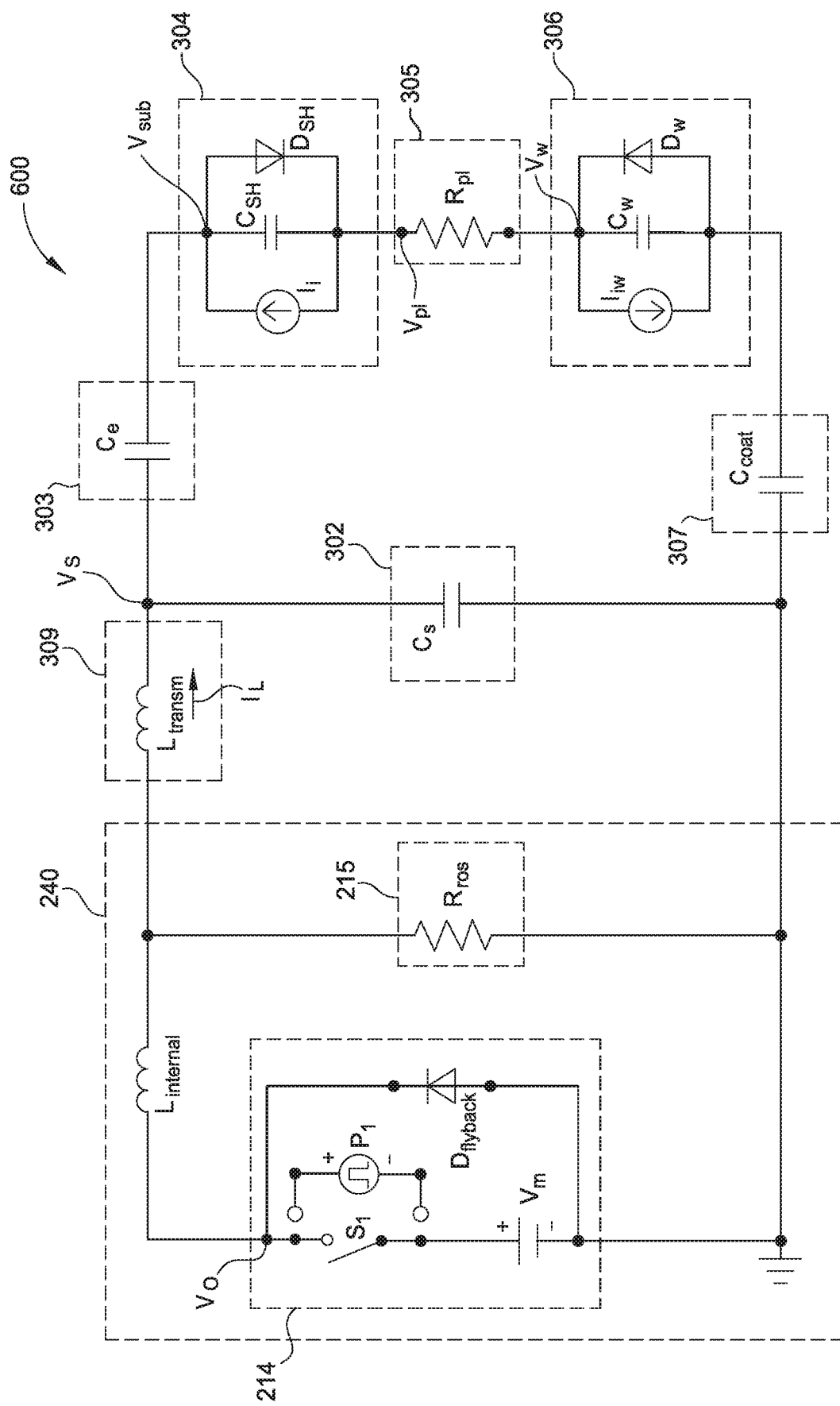
FIG. 6 is a simplified circuit diagram of the biasing scheme described in relation to FIGS. 2-3.

One embodiment of the pulsed voltage biasing scheme proposed above is shown in the chamber diagram illustrated in FIG. 2; the equivalent electrical circuit of this biasing scheme is illustrated in FIG. 3; and the simplified form of this equivalent electrical circuit is shown in FIG. 6. The simplified electrical circuit shown in FIG. 6 is modeled numerically to produce the results shown in FIGS. 7A-7H.

FIG. 2 shows the chamber diagram that includes the pulsed voltage biasing scheme proposed above, in accordance with one embodiment (a more detailed description of FIG. 2 is given later in the text). The biasing scheme described herein fundamentally consists of the following main components:

(1) a nanosecond pulse generator 214 that maintains a predetermined, substantially constant positive voltage across its output (i.e. to ground) during regularly recurring time intervals of a predetermined length, by repeatedly closing and opening its internal switch at a predetermined rate. FIG. 2 shows a simplified, functionally equivalent schematic representation of the nanosecond pulse generator. In FIG. 2, the nanosecond pulse generator is reduced to a minimal combination of the components that are important for understanding of its role in establishing a desired pulsed voltage waveform (such as waveform 500) at the biasing electrode (such as chucking pole 204). These components generally include an internal voltage source, a high repetition rate switch, and a flyback diode. It needs to be understood that an actual nanosecond pulse generator may include any number of internal components and may be based on a more complex electrical circuit than that of FIG. 2. In turn, a schematic diagram of FIG. 2 provides only a functionally equivalent representation of the components of the nanosecond pulse generator and its electrical circuitry, inasmuch as is required to explain the fundamental principle of its operation, its interaction with the plasma in the processing volume, and its role in establishing a pulsed voltage waveform (such as waveform 500) at the biasing electrode (such as chucking pole 204). As can be inferred from a schematic diagram shown in FIG. 2, when the switch $S_1$ moves from the open (Off) to the closed (On) position, it connects the output of the nanosecond pulse generator to its internal voltage source that produces a substantially constant output voltage. In fact, as can be seen from a more detailed (but still simplified) equivalent electrical circuit of one implementation of the nanosecond pulse generator shown in FIG. 3, the switch actually connects the internal battery to the step-up output transformer. This detail is not critical for understanding of the fundamental principle of operation of the nanosecond pulse generator and its function in establishing a pulsed voltage waveform (such as waveform 500) at the biasing electrode (such as chucking pole 204), but it has an important practical implication that will be described later. The purpose of a flyback diode, which can also be substituted by a different snubber circuit, is to suppress, or "snub", a possible voltage spike caused by opening of the switch $S_1$, which is followed by a rapid release of the magnetic energy accumulated in the inductive elements. These inductive elements comprise: (A) an external electrical conductor, such as the transmission line 206 with the combined inductance $L_{transm}$, and (B) components of the pulsed bias generator 240, including an internal electrical conductor connecting the nanosecond pulse generator 214 and the current-return output stage 215, with the combined inductance $L_{internal}$. The magnetic energy accumulates in inductive elements during the time interval, when the switch $S_1$ remains in the closed position and the nanosecond pulse generator supplies the current to the system. The magnitude $V_m$ of the nanosecond pulse generator output voltage, $V_0$, during the time interval when the switch $S_1$ is in the closed (On) position, and a substantially constant positive output voltage (equal to $V_m$) is maintained, can be as high as several kilovolts (e.g., 0.1-10 kV). The time interval during which the switch remains in the closed (On) position and the substantially constant positive output voltage is maintained is referred to as the "pulse width", $\tau_p$, and it can be as long as several tens of nanoseconds (e.g., 10-100 ns). In turn, the time interval during which the switch transitions from the open (Off) to the closed (On) position is referred to as the "rise time", $\tau_{rise}$, and it can also be several tens of nanoseconds (e.g., 25-50 ns). As the switch transitions from the open to the closed position, the output voltage of the nanosecond pulse generator gradually increases until it reaches $V_m$. Finally, the length of time between the two consecutive transitions from the open (Off) to the closed (On) position (or vice versa) is referred to as the "period", T, and it is equal to the inverse of the pulse repetition frequency, which can be as high as 400 kHz, for example. We note the following: (a) in the pulsed voltage biasing scheme proposed herein, a nanosecond pulse generator is used primarily as a charge injector (current source), and not as a constant voltage source; therefore it is not necessary to impose stringent requirements on the stability of its output voltage, in that it can vary in time even when the switch remains in the closed (On) position; (b) a nanosecond pulse generator is fundamentally a sourcing, but not a sinking supply, in that it only passes a current in one direction (so it can only charge, but not discharge a capacitor, for example); (c) when the switch remains in the open (Off) position, the voltage, $V_0$, across the output of the nanosecond pulse generator is not controlled by the internal voltage source and is instead determined by the interaction of its internal components with other circuit elements; and (d) the name "nanosecond pulse generator" originates from the fact that when it is operating into a low stray capacitance/inductance, predominantly resistive load, it generates a voltage waveform across its output, which can be described as a series of ground referenced positive voltage pulses.

(2) a current-return output stage, 215, with one end 215B connected to ground, and the other end 215A connected through the internal electrical conductor to the positive output of the nanosecond pulse generator and simultaneously to the external electrical conductor. The combination of the nanosecond pulse generator with the current-return output stage and the internal electrical conductor is referred to here as a "pulsed bias generator" 240 and it is both a sourcing and a sinking supply, in that it passes a current in both directions. A current-return output stage can be comprised of the following elements: (a) a resistor, (b) a resistor and an inductor connected in series, or (c) a more complex combination of electrical elements, including parallel capacitors, which permits a positive current flow towards the ground.

(3) An external electrical conductor connecting the output of the pulsed bias generator 240 to the chucking pole. The output of the pulsed bias generator 240 is the point 215A, where the output of the nanosecond pulse generator 214 is connected through the internal electrical conductor to the current-return output stage 215. The external electrical conductor may comprise: (a) a coaxial transmission line 206, which may include a flexible coaxial cable with the inductance $L_{flex}$ in series with a rigid coaxial transmission line with the inductance $L_{rigid}$, (b) an insulated high-voltage corona-resistant hookup wire, (c) a bare wire, (d) a metal rod, (e) an electrical connector, or (f) any combination of electrical elements in (a)-(e). Note that the internal electrical conductor may comprise the same basic elements as the external electrical conductor. The chucking pole is usually a metal plate embedded into the electrostatic chuck and separated from the plasma by a thin layer of dielectric material (e.g., ~0.3 mm thick). The chucking pole can be the biasing electrode 204 embedded within the electrostatic chuck portion (i.e., ESC substrate support 205) of the ESC assembly shown in FIG. 2. The external conductor, such as the transmission line 206, and the biasing electrode 204 have some combined stray capacitance to ground, $C_s$.

FIG. 3 depicts a functionally equivalent, simplified electrical circuit 300 of the pulsed voltage biasing scheme proposed herein, including the plasma in the process volume. In turn, FIG. 6 depicts a circuit 600, which is a further simplified version of the circuit 300. These circuits are used only to model the main aspects of the interaction of the pulsed bias generator (such as 240) with the processing chamber 308; explain its basic principle of operation and its role is establishing of the pulsed voltage waveform (such as 500) at a biasing electrode (such as 204); describe the accompanying physical phenomena taking place during different phases of the pulsed voltage waveform (such as 500); and generally explain the basic principle of operation of the pulsed voltage biasing scheme proposed herein. In practice, interaction of the pulsed voltage biasing scheme described herein with the plasma in the process volume may be accompanied by complex physical phenomena (e.g., high-frequency oscillations caused by the presence of inductive elements, such as external and internal electrical conductors), which are largely omitted from consideration here. It needs to be understood, however, that while the discussion (later in the text) in relation to the phases 501-504 of the pulsed voltage waveform (such as 500) is largely based on the simplified circuit model 600 with some more complex physical phenomena omitted from consideration, those phenomena are not critical for understanding of the basic principle of operation of the pulsed voltage biasing scheme proposed herein. Furthermore, although the waveforms in FIGS. 5A-5B and 7A-7H are produced by numerically simulating the simplified circuit 600 using OrCAD P-Spice Designer software (with a different set of circuit parameters used to generate each figure set), the main underlying physical phenomena revealed by the modeling (namely, sheath collapse, ESC recharging, sheath formation, and charging of the substrate surface by the ion current) are relevant for an actual system. In the equivalent circuits 300 and 600 shown in FIGS. 3 and 6, respectively, all relevant physical components displayed in the chamber diagram of FIG. 2 are represented by discrete circuit elements, according to the following explanations.

Firstly, the dielectric layer in the electrostatic chuck, and the processed substrate (e.g., a 0.8 mm thick doped-silicon slab with the capacitance of >10 nF) placed on its surface separate the chucking pole from the plasma and are represented in the circuits in FIGS. 3 and 6 by a single chuck capacitor 303 (which in reality is two capacitors connected in series) with a capacitance $C_e$ (~7-10 nF, for example). In other words, we consider the substrate (typically made out of a thin layer of a semiconductor and/or dielectric material) to be electrically a part of the ESC dielectric layer and whenever we refer to the chuck capacitance $C_e$, we will imply that $C_e$ is the combined series capacitance of the ESC (i.e., $C_{ESC}$) and the substrate (i.e., $C_{wafer}$). Since the substrate capacitance $C_{wafer}$ is typically very large (>10 nF), or substrate may be conductive (infinite capacitance), the series capacitance is determined primarily by the actual $C_{E}SC$.

Secondly, the chucking pole 204, the pulsed bias generator 240, and the external electrical conductor (such as the transmission line 206) connecting them together have: (A) some combined stray capacitance to ground, which is represented in the circuit 600 by a single stray capacitor 302 with the capacitance $C_s$ (~500 pF, for example); as well as (B) some inductance, which is represented in the circuit 600 by inductors $L_{internal}$ (~300 nH, for example) for the internal electrical conductor and other components of the pulsed bias generator 240, and $L_{transm}$ (~500 nH, for example) for the external electrical conductor, such as the transmission line 206. The current-return output stage 215 is represented in the circuit 600 by a single resistor $R_{ros}$ (~150 Ohm, for example).

Thirdly, we use the standard electrical plasma model that represents the entire plasma in the process volume as 3 series elements:

I. An electron-repelling cathode sheath 304 (which we sometimes also refer to as the "plasma sheath" or just the "sheath") adjacent to the substrate. The cathode sheath is represented in FIGS. 3 and 6 by a conventional 3-part circuit element comprising: (a) the diode $D_{SH}$, which when open represents the sheath collapse, (b) the current source $I_i$ (e.g., ~0.5-5 A), representing the ion current flowing to the substrate in the presence of the sheath, and (c) the capacitor $C_{SH}$ (100-300 pF, for example, for high aspect ratio applications), which represents the sheath for the main portion of the biasing cycle (~90%), i.e. ion current phase, during which the ion acceleration and the etching occur.

II. a bulk plasma 305, represented in FIGS. 3 and 6 by a single resistor $R_{pl}$ (e.g., ~5-10 Ohms), III. an electron-repelling wall sheath 306 forming at the chamber walls. The wall sheath is likewise represented in FIGS. 3 and 6 by a 3-part circuit element comprising: (a) the diode $D_w$, (b) the current source $I_{iw}$ (e.g., ~5-10 A) representing the ion current to the wall, and (c) the capacitor $C_w$ (e.g., ~5-10 nF), which represents the wall sheath primarily during the ESC recharging phase 502 (described later in the text), when there is no electron-repelling cathode sheath and the wall sheath capacitor is being charged by the large current pushed through the ESC by the nanosecond pulser. Because the cathode sheath is much thicker than the wall sheath (due to a high voltage), and the total wall area is much larger than the substrate area, we have selected $C_w \gg C_{SH}$. The interior surface of the grounded metal walls is considered be coated with a thin layer of a dielectric material, represented in FIGS. 3 and 6 by a large capacitor $C_{coat}$ (e.g., ~300-1000 nF).

Figure 4:
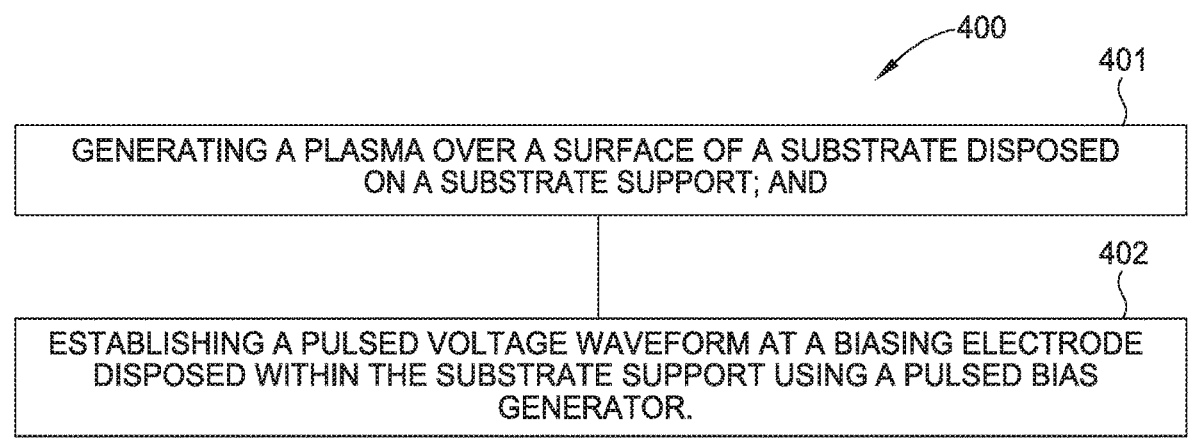
FIG. 4 is a flow diagram of a method of processing a substrate using a pulsed voltage biasing scheme described herein, according to one embodiment.

FIG. 4 depicts a flow diagram illustrating a method 400 of processing a substrate using the pulsed voltage biasing scheme described herein, according to one embodiment. At activity 401, the method 400 includes generating a plasma over a surface of a substrate disposed on a substrate support. At activity 402, the method 400 includes establishing a pulsed voltage waveform at a biasing electrode disposed within the substrate support using a pulsed bias generator coupled to the biasing electrode using an external electrical conductor, such as a transmission line 206.

Figure 5A:
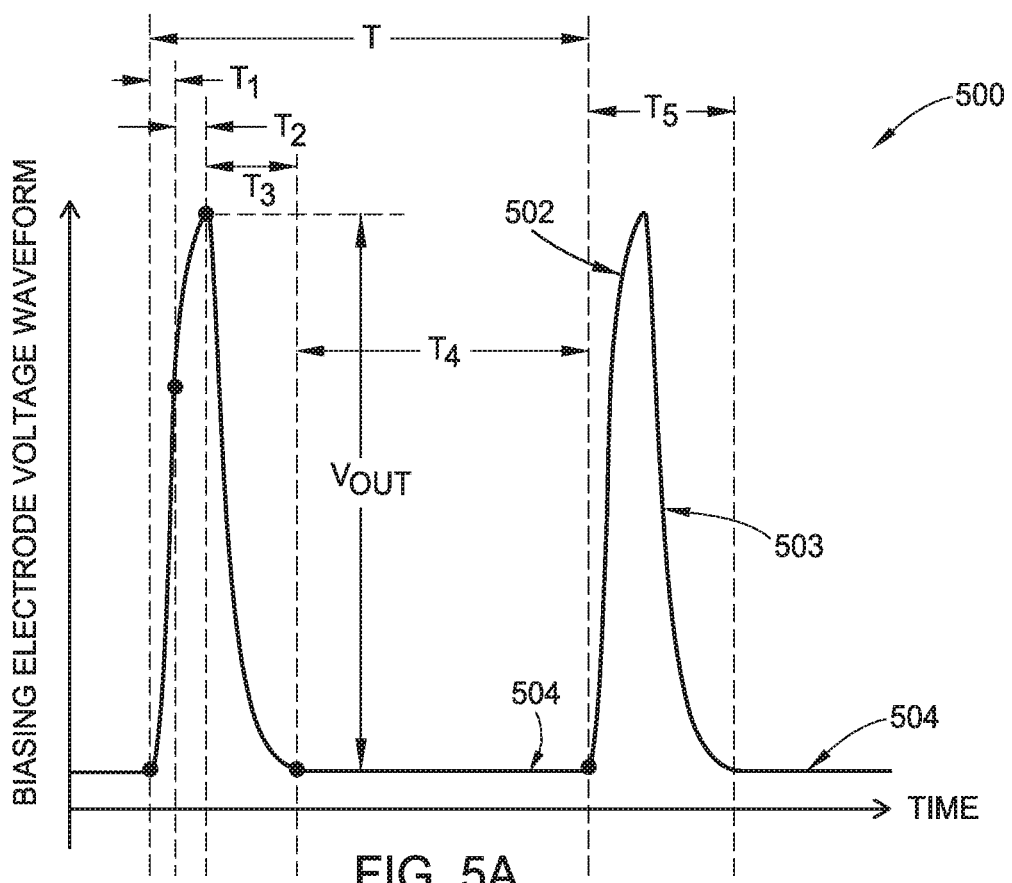
FIGS. 5A-5C illustrate the method set forth in FIG. 4.

FIG. 5A illustrates the pulsed voltage waveform 500 established at the biasing electrode. The pulsed voltage waveform 500 shown in FIG. 5A results in the substrate voltage waveform 510 shown in FIG. 5B, and thus enables keeping the sheath voltage nearly constant for about 90% of the substrate processing time. Voltage waveforms 500 and 510 pictured in FIGS. 5A-5B, as well as waveforms shown in FIGS. 7A-7H, were produced by numerically simulating the simplified circuit 600 using OrCAD P-Spice Designer software. The circuit parameters used to generate FIGS. 5A-5B were selected to clearly illustrate the different phases of the waveforms 500 and 510 (for example, the waveform period was set to 1 μs). Conversely, the parameters used to generate FIGS. 7A-7H were selected to demonstrate a potential practical implementation of the pulsed voltage biasing scheme proposed herein (for example, the waveform period was set to 2.5 μs). We note that waveforms illustrated in FIGS. 5A-5B and 7A-7H should be interpreted as simplified, schematic representations of the experimentally observable waveforms, such as the one shown in FIG. 8. The actual waveforms can be significantly more complex and contain a number of fine-scale features (e.g., high-frequency oscillations caused by the presence of inductive elements, such as external and internal electrical conductors) that are not shown in FIGS. 5A-5B and 7A-7H. However, these fine-scale features are not essential for understanding of the underlying physical phenomena determining the general shape of the actual pulsed voltage waveform produced by the pulsed voltage biasing scheme proposed herein. Thus, while the discussion below is largely based on the circuit 600 and simulated waveforms shown in FIGS. 5A-5B and 7A-7H, the main underlying physical phenomena (namely, sheath collapse, ESC recharging, sheath formation and charging of the substrate surface by the ion current) taking place during the phases 501-504 of the pulsed voltage waveform cycle are relevant for an actual system.

Figure 5B:
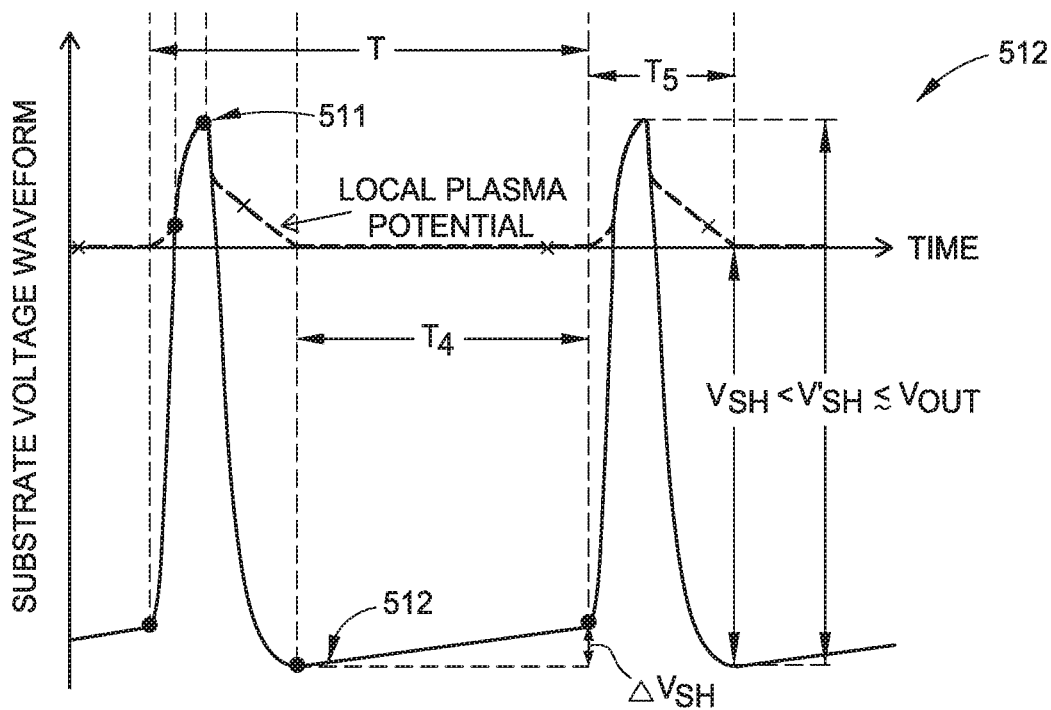

In FIG. 5A, the pulsed voltage waveform 500 comprises a periodic series of short positive pulses repeating with a period T (e.g., 2.5 microseconds), on top of a voltage offset. A waveform within each period (repetition cycle) includes the following:

(1) A positive voltage jump to charge the system's stray capacitor and collapse the cathode sheath, i.e., the sheath collapse phase 501, during which the sheath capacitor is discharged and the substrate potential is brought to the level of the local plasma potential (as illustrated in FIG. 5B). The sheath collapse phase 501 enables rapid recharging of the chuck capacitor by electrons provided from the plasma during the ESC recharging phase 502. The switch $S_1$ (see FIG. 6) closes and remains in the closed (On) position for the duration of the phase 501, allowing the nanosecond pulse generator, such as 214, to maintain a substantially constant positive voltage across its output and supply a current to the system. The duration $T_1$ of the phase 501 is much shorter than the duration $T_4$ of the ion current phase 504 (described below) or than the overall period T, and is typically of the order of several tens of nanoseconds (e.g., 20-50 ns). This is because the plasma current during the phase 501 is carried by electrons—namely, the electron cloud is moving towards the substrate and gradually sweeps over the ion space charge, thus eliminating the sheath voltage drop—and the electron velocity is much greater than the ion velocity, due to a very large mass ratio between the two species.

(2) Recharging of the chuck capacitor $C_e$, during the ESC recharging phase 502, by rapidly injecting a charge of equal value and opposite polarity to the total charge accumulated on the substrate surface during the ion current phase 504 (described below). As during the phase 501, the nanosecond pulse generator 214 maintains a substantially constant positive voltage across its output (switch $S_1$ remains in the On position). Similarly to the phase 501, the duration $T_2$ of the phase 502 is much shorter than the duration $T_4$ of the ion current phase 504 (described below) or than the overall period T, and is typically of the order of several tens of nanoseconds (e.g., 30-80 ns). This is because the plasma current during the phase 502 is also carried by electrons—namely, in the absence of the cathode sheath, the electrons reach the substrate and build up the surface charge, thus charging the capacitor $C_e$.

(3) A negative voltage jump ($V_{OUT}$) to discharge the processing chamber's stray capacitor, re-form the sheath and set the value of the sheath voltage ($V_{SH}$) during the sheath formation phase 503. The switch $S_1$ in FIG. 6 opens at the beginning of the sheath formation phase 503 and the inductive elements rapidly (within about 10 nanoseconds, for example) release their stored magnetic energy into the chuck capacitor, $C_e$, and the stray capacitor, $C_s$. Inductive elements may include the internal components of the pulsed bias generator 240 (e.g. the internal conductor) represented by the inductance $L_{internal}$, and the external conductor (e.g. the transmission line 206) represented by the inductance $L_{transm}$ numbered 309 in circuit 600. During the magnetic energy release, the corresponding current flows through the flyback diode or a different snubber circuit with a similar function of suppressing (or "snubbing") the possible voltage spikes. As can be seen from the time-plot of the nanosecond pulse generator output voltage, $V_0$, shown in FIG. 7B, during the magnetic energy release, the internal voltage source of the nanosecond pulse generator (such as 214) does not maintain a positive output voltage (switch $S_1$ remains in the Off position), so it briefly collapses to several volts below zero to allow the flyback diode to pass the current. We note here, that without the flyback diode (or a different component with a similar function of "snubbing" the possible voltage spikes), the magnetic energy would need to be released through the resistive current-return output stage, resulting in an impractically large negative voltage across R (e.g. −20 kV, which is potentially damaging to the internal components of the pulsed bias generator 240) for several nanoseconds, instead of collapsing to near-zero values. After the magnetic energy is released and the current through $L_{transm}$ drops to zero (as well as through $L_{internal}$), it reverses the direction and flows from the plasma and the stray capacitor to ground through the current-return output stage (the flyback diode, being reverse-biased, blocks the current flow through itself), thus discharging the stray capacitor, $C_s$, and charging the sheath capacitor, $C_{sh}$, (i.e. re-forming the sheath). The beginning of sheath formation (charging of $C_{sh}$) can be clearly identified in FIG. 5B as the point, at which the substrate potential starts decreasing below the local plasma potential. Similarly to the phase 501, the duration $T_3$ of the phase 503 is much shorter than the duration $T_4$ of the ion current phase 504 (described below) or than the overall period T, and is typically of the order of 100-300 ns. This is because the plasma current during the phase 503 is likewise carried by electrons—namely, the electron cloud is moving away from the substrate and gradually exposes the ion space charge, thus forming the sheath and producing the sheath voltage drop. We note that (1) $T_3$ is determined primarily by the stray capacitance, as well as the values of the elements (e.g. resistor) comprising the current-return output stage; and (2) the negative voltage jump, $V_{OUT}$, and established sheath voltage, $V_{SH}$, are determined by $V_m$ (magnitude of the nanosecond pulse generator output voltage during phases 501-502), and the total pulse width, $\tau_{tot}=\tau_{rise}+\tau_p=T_1+T_2$. To explain the effect of $\tau_{tot}$ (practically controlled parameter) on $V_{OUT}$ and $V_{SH}$, we notice that both $T_2$ and the increase in the biasing electrode voltage, $\Delta V_{s,2}$, during the phase 502 are determined primarily by $V_m$ and the ion current, $I_i$. Therefore, for given $V_m$ and $I_i$, the total pulse width, $\tau_{tot}$, controls $T_1$, which in turn determines the increase in the substrate voltage, $\Delta V_{sub,1}$, and biasing electrode voltage $\Delta V_{s,1} \cong \Delta V_{sub,1}$, during phase 501, and hence $V_{OUT}=\Delta V_{s,1}+\Delta V_{s,2}$, and $V_{SH}=\Delta V_{sub,1}$.

(4) A long (about 85-90% of the cycle duration T) ion current phase 504 with the duration $T_4$, during which the nanosecond pulse generator 214 likewise does not maintain a positive voltage across its output (switch $S_1$ remains in the Off position) and the ion current flows from plasma to ground through the current-return output stage. The ion current causes accumulation of the positive charge on the substrate surface and gradually discharges the sheath and chuck capacitors, slowly decreasing the sheath voltage drop and bringing the substrate potential closer to zero. This results in the voltage droop $\Delta V_{sh}$ in the substrate voltage waveform 510 shown in FIG. 5B. The generated sheath voltage droop is why the pulsed voltage waveform 500 needs to move to the next cycle described in (1)-(3) above, during which the nanosecond pulse generator 214 removes the charge accumulated during the ion current phase (or restores the initial ESC charge) and reestablishes the desired sheath voltage, $V_{SH}$. Note that the surface charge and sheath voltage droop accumulate whenever there is an electron-repelling cathode sheath and the unbalanced net current (equal to the ion current) from the bulk plasma. As was previously explained, this is because the ion current from the bulk plasma is not balanced by the electron current from the bulk plasma, due to the sheath electric field repelling the electrons away from the substrate. Thus, the surface charge accumulation and voltage droop generation also take place during the sheath formation phase 503, during which there is a non-zero sheath voltage drop present right from the beginning.

Figure 1A:
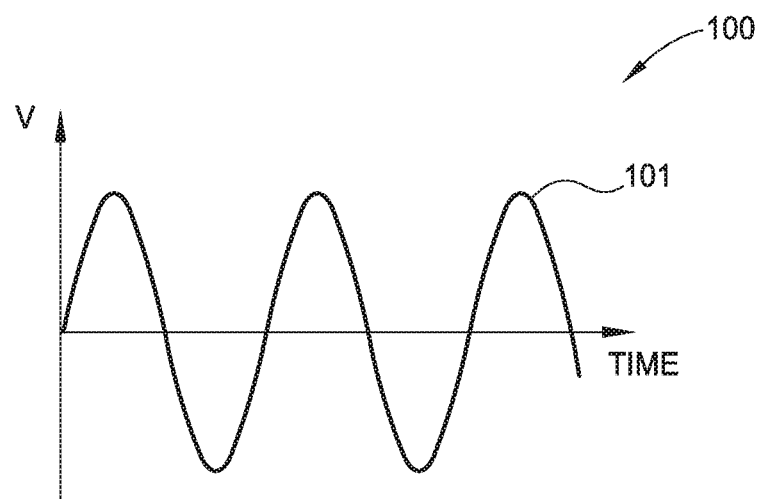
FIG. 1A illustrates an RF voltage waveform provided to a biasing electrode of a plasma processing chamber, according to the prior art.
Figure 1B:
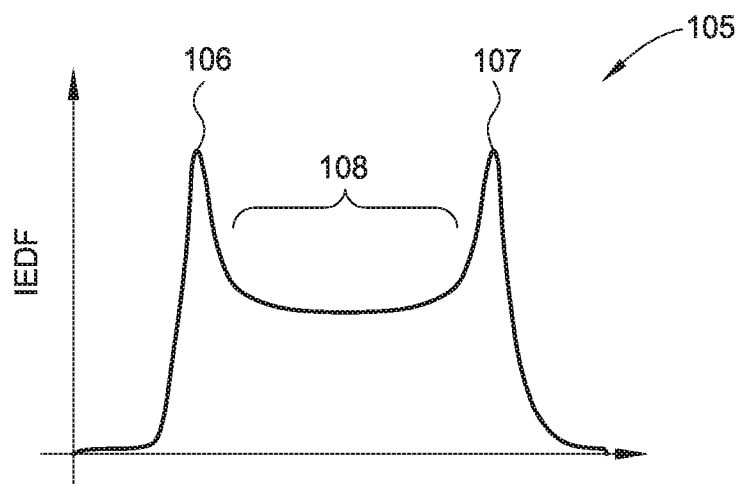
FIG. 1B illustrates an Ion Energy Distribution Function (IEDF) at the surface of a substrate during a plasma process performed in a conventional process chamber, according to the prior art.

As can be seen from the (1)-(4) above, the combined duration of the "electron current" phases 501-503 constituting a single voltage pulse of the pulsed voltage waveform (such as the pulsed voltage waveform 500) is about 200-400 ns, which corresponds to the relatively short duty cycle of about 10-15%. The short duty cycle characteristic of the pulsed voltage waveform 500 is a consequence of a large ion-to-electron mass ratio that is typical for all plasmas. Thus, in the pulsed voltage biasing scheme proposed herein, the pulsed bias generator actively interacts with the plasma only during a short portion of each cycle, allowing the cathode sheath to evolve naturally for the rest of the time. By effectively using the fundamental plasma properties, this biasing scheme enables maintaining a nearly constant sheath voltage for up to ~90% of the processing time, which results in a single peak IEDF (such as IEDF 520 in FIG. 5C). Conversely, in a conventional biasing scheme, an applied RF voltage (having a waveform such as the one shown in FIG. 1A) modulates the cathode sheath throughout the entire RF period, thus unduly varying the sheath voltage drop all of the time and resulting in a dual-peak IEDF (such as an IEDF shown in FIG. 1B).

Figure 7B:
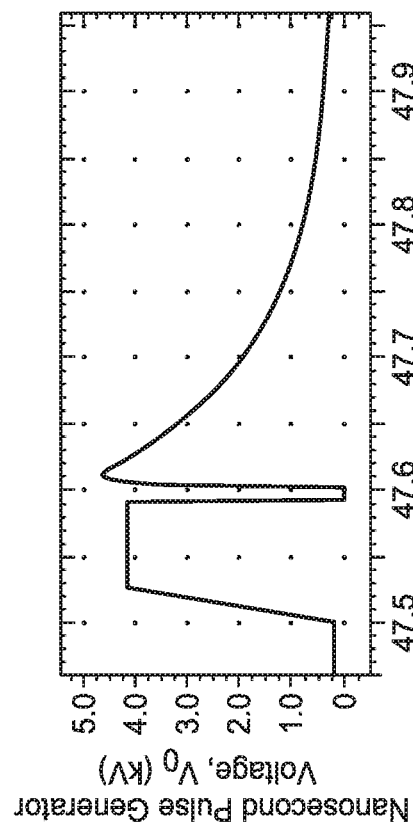
FIGS. 7A-7H illustrate the results of numerical simulations of biasing schemes described herein.
Figure 7D:
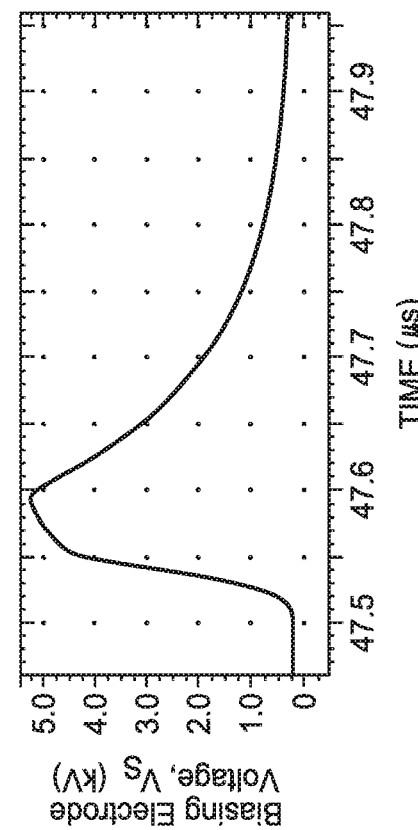

The pulsed voltage biasing scheme proposed herein enables maintaining a particular substrate voltage waveform, such as the substrate voltage waveform 510 shown in FIG. 5B, which can be described as a periodic series of short positive pulses 511 on top of the negative voltage offset 512. During each pulse (having a total duration of $T_5=T_1+T_2+T_3$), the substrate potential reaches the local plasma potential and the sheath briefly collapses. However, for about 90% of each cycle (having a cycle duration T), the sheath voltage drop remains nearly constant and approximately equal to the absolute value of the most negative substrate potential, $V_{SH}$ (FIG. 5B), which thus determines the mean ion energy at the substrate surface. During the sheath collapse phase 501 of the biasing cycle, the current from the nanosecond pulse generator (e.g., 214) splits between the processing plasma and the stray capacitor $C_s$, connected in parallel, approximately according to the ratio $C_{SH}/C_s$ and is not very significant. Because of that and because $C_w$ is generally very large, the voltage drop accumulating across the wall sheath during phase 501 is relatively small. As a result, the near-wall plasma potential, $V_w$, which is equal to the sum of the wall sheath voltage drop and the expectedly small (due to a very large $C_{coat}$) voltage drop across the wall dielectric coating (FIG. 6), remains close to zero (FIG. 7F). Hence, the local (near-substrate) plasma potential, $V_{pl}$, which is equal to the sum of the near-wall plasma potential and the voltage drop across the bulk plasma (FIG. 6), is determined primarily by the latter, and it increases slightly above zero (FIGS. 5B and 7F). In turn, during the ESC recharging phase 502 there is no electron-repelling cathode sheath and the wall sheath capacitor is being charged to a substantial voltage (e.g. several hundred volts) by the large current pushed through the ESC by the nanosecond pulse generator (e.g. 214). Due to the increase of the near-wall plasma potential, as well as the presence of a comparably large voltage drop across the bulk plasma (caused by the same large current), the local (near-substrate) plasma potential, $V_{pl}$, as well as the substrate potential, $V_{sub}$, experience a substantial increase of up to about ⅓ of the established sheath voltage, $V_{SH}$. Finally, during the sheath formation phase 503, the current through the processing plasma is again (as in phase 501) determined by the ratio $C_{SH}/C_s$ and is relatively small (also quickly decaying), as well as the resultant voltage drop across the bulk plasma. Therefore, the local (near-substrate) plasma potential remains approximately equal to the near-wall plasma potential, and they both relax to near-zero values closer to the end of the phase 503, as the wall sheath gets discharged primarily by the ion current to the chamber walls. As a result of the local plasma potential perturbation during phases 501-503, the established sheath voltage, $V_{SH}$, constitutes only ~75% of the overall negative jump in the substrate voltage waveform 510 at the end of the phase 503, $V'_{SH}$. The negative jump $V'_{SH}$ defines the maximum sheath voltage for given $V_m$ and $\tau_{tot}$ (attainable only with near-infinite $C_w$ and near-zero $R_{pl}$), and it is close to the negative jump in the biasing electrode voltage waveform 500, $V'_{SH} \sim V_{OUT}$. The latter is because during the phase 503, the chuck capacitor transfers only a small portion ($\propto C_{SH}/C_e \ll 1$) of its initial charge to the sheath, thus maintaining a nearly constant potential difference between the electrode and the substrate. The relationship $V_{SH}/V_{OUT} \sim 0.75$-$0.8$ can be used in practice to estimate $V_{SH}$ from the measured $V_{OUT}$.

A. Practical Considerations

The effective simplified electrical circuit 600 and the results of numerical simulations of that circuit are shown in FIGS. 6 and 7A-7H respectively. We note that to simulate a non-ideal switch with a finite closing time, in the actual PSPICE model we have substituted the constant voltage source, $V_m$, with a trapezoidal voltage pulse (synchronized with the switch control voltage pulse $P_1$) with the maximum voltage $V_m$ and a finite rise-time. All circuit parameters used in modeling are given in Table 1:

corresponding waveform period is 2.5 microseconds. The substrate potential waveforms of FIGS. 7E and 7F comprise a small voltage droop (shown as $\Delta V_{sh}$ in FIG. 5B), which accumulates over the course of the ion current phase 504 and can be estimated as follows. Because during the ion current phase 504: (a) the voltage at the biasing electrode (i.e., chucking pole) remains constant at the level determined by the resistor $R_{ros}$ in the current-return output stage, $V_{esc} = I_i * R_{ros}$, and (b) the plasma potential also remains constant (close to zero)—it can be readily obtained that the sheath voltage droop $\Delta V_{sh}$ over the duration $T_4$ of the ion current phase 504 (which is close to the waveform period T) is given by a formula:

$$\Delta V_{sh} = \frac{I_i T}{C_e + C_{SH}}, \quad (1)$$

where $I_i$ is the ion current flowing through the sheath. This formula reflects the fact that the ion current splits between the sheath capacitor, $C_{SH}$, and the chuck capacitor, $C_e$, and needs to discharge them both in order to change the sheath voltage. The above formula can be used to select the appropriate parameters for effective operation of the pulsed voltage biasing scheme proposed herein, and allows determination of its applicability limits.

For example, from the goal of maintaining a nearly constant sheath voltage, $V_{SH}$, we immediately get the requirement of a relatively small voltage droop, i.e.

$$\frac{I_i T}{C_e + C_{SH}} \ll V_{SH}.$$

TABLE 1

| $V_m$ | $\tau_{rise}$ | $\tau_p$ | T | $L_{internal}$ | $L_{transm}$ | $R_{ros}$ | $C_s$ | $C_e$ | $C_{SH}$ | $I_i$ | $R_{pl}$ | $C_w$ | $I_{iw}$ | $C_{coat}$ |
|---|---|---|---|---|---|---|---|---|---|---|---|---|---|---|
| 4175 V | 25 ns | 65 ns | 2.5 μs | 300 nH | 400 nH | 150Ω | 500 pF | 7 nF | 150 pF | 1.5 A | 7.5Ω | 5 nF | 5.5 A | 1 μF |

Figure 7A:
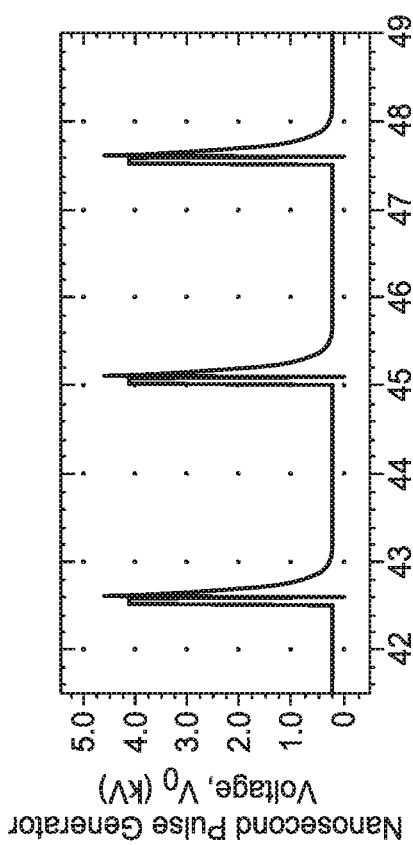
Figure 7C:
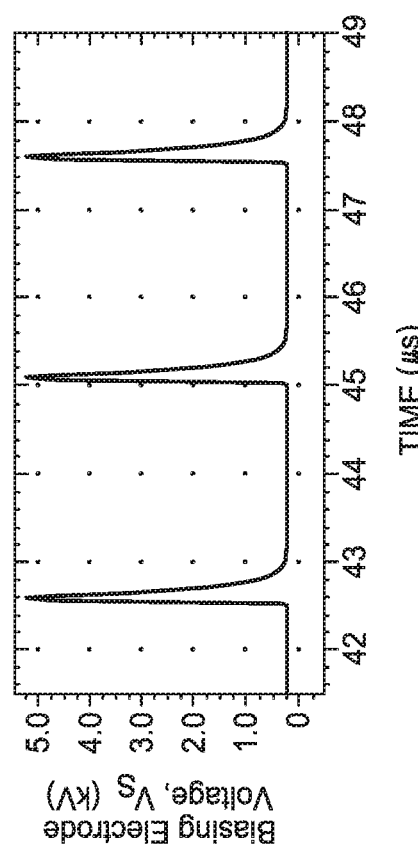
Figure 7E:
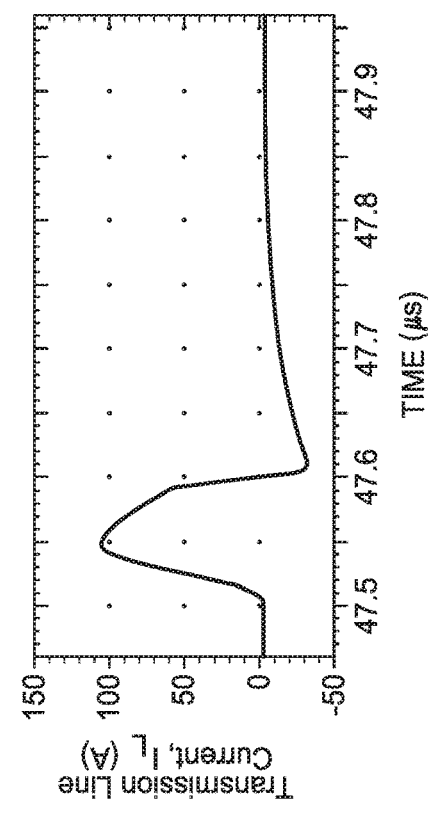
Figure 7F:
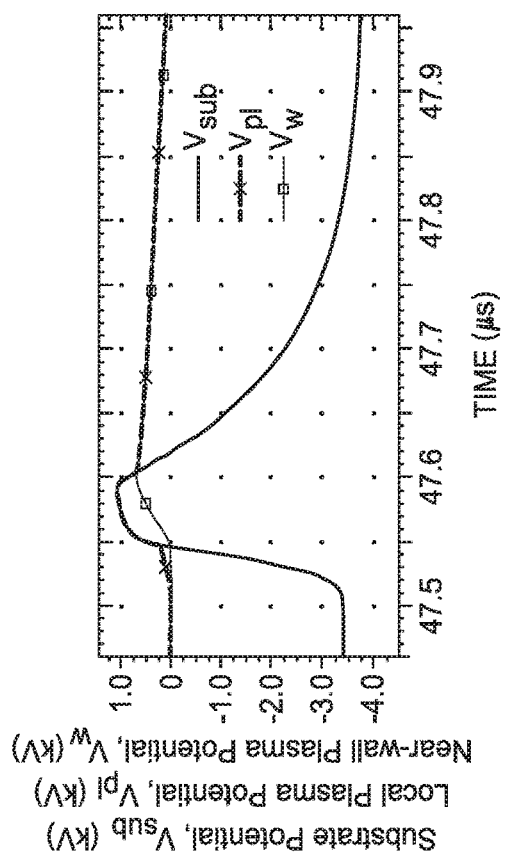
Figure 7G:
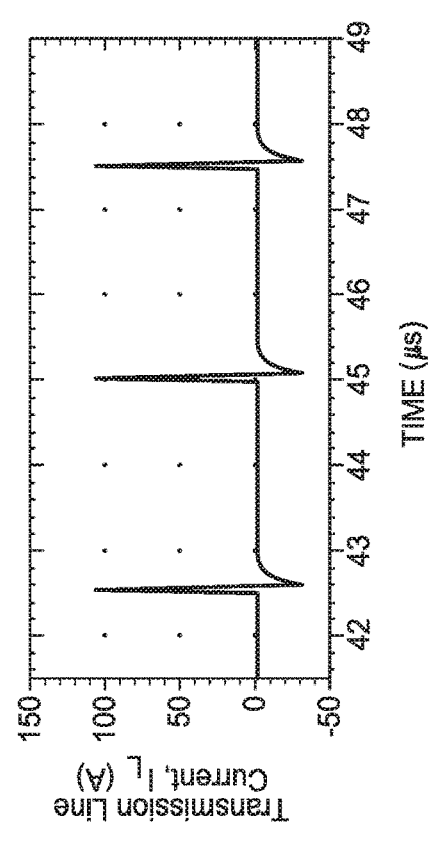
Figure 7H:
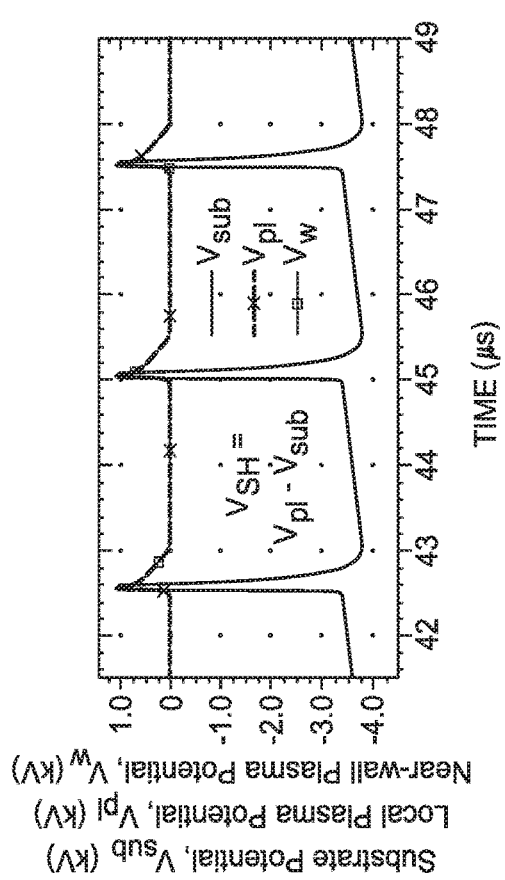

FIG. 7A illustrates a modeled nanosecond pulse generator output voltage over time, $V_0(t)$, (and 3 waveform cycles). FIG. 7B is a close up view of a portion of FIG. 7A. FIG. 7C illustrates a modeled voltage at the biasing electrode, $V_s(t)$, i.e. the voltage across $C_s$, as shown in circuit 600 of FIG. 6. FIG. 7D is a close up view of a portion of FIG. 7C. FIG. 7E illustrates modeled substrate potential, $V_{sub}$, local (near-substrate) plasma potential, $V_{pl}$, and near-wall plasma potential, $V_w$, as shown in FIG. 6. FIG. 7F is a close up view of a portion of FIG. 7D. FIG. 7G illustrates a modeled current through the external conductor (such as the transmission line 206) coupling the pulsed bias generator to the biasing electrode, $I_L(t)$, i.e., the current through the inductance $L_{transm}$ in circuit 600 of FIG. 6. FIG. 7H is a close up view of a portion of FIG. 7G.

Figure 5C:
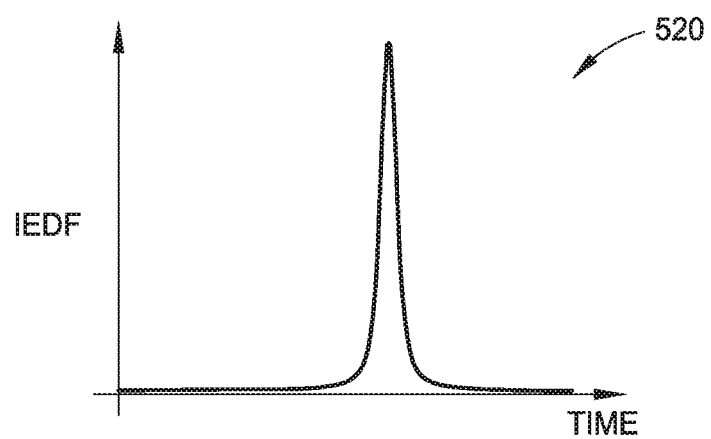

Numerical results in FIGS. 7E and 7F clearly demonstrate that using a pulsed bias generator 240 (comprising a nanosecond pulse generator 214 and a current return output stage 215) produces a nearly constant sheath (and substrate) voltage for the majority of the waveform period, thus creating a narrow single-peak IEDF (such as the single-peak IEDF 520 shown in FIG. 5C). The pulse repetition frequency used to obtain the results in FIGS. 7A-H is 400 kHz, and the For a given ion current (typically 0.5-5 A), $C_e$ and T, it gives the range of sheath voltages, for which the pulsed voltage biasing scheme proposed herein is most useful. This requirement shows that the effectiveness of this biasing scheme in producing a narrow single-peak IEDF (i.e. IEDF 520 in FIG. 5C) increases with the desired sheath voltage and ion energy, which makes it particularly suitable for such challenging high aspect ratio applications as "hard mask open" and "dielectric mold etch", for example. More accurately, the relative width of the single energy peak in the "monoenergetic" IEDF created with the use of the biasing scheme described herein is determined by the ratio $\Delta V_{sh}/V_{SH}$ or, in practical terms, by $C_e$, $I_i$, and T.

The above requirement also implies that the pulsed voltage biasing scheme proposed herein works better at higher pulse repetition frequencies (PRF) (or shorter periods T) of the pulsed voltage waveform (e.g. the voltage waveform 500 in FIG. 5A). Indeed, as can be seen from eq. (1), the value of the voltage droop, $\Delta V_{sh}$, increases with the period, T. In turn, an increase in the voltage droop leads to an increase in the relative width of the single-peak IEDF produced using the pulsed voltage biasing scheme proposed herein, $\Delta V_{sh}/V_{SH}$, consequently diminishing one's ability to precisely control the shape of the arbitrary IEDF created using this single-peak IEDF. However, we note that the choice of PRF must be balanced against two additional considerations. Namely: (a) the challenges of producing high-voltage nanosecond pulses increase greatly with the switching frequency, and (b) the duration $T_4$ of the ion current phase 504, during which ions are accelerated towards the substrate surface and ion bombardment of the substrate surface occurs (e.g., etching occurs during an etching process), needs to be much longer than the combined duration $T_1+T_2+T_3$ of the sheath collapse phase 501, the ESC recharging phase 502, and the sheath formation phase 503. This combined duration is determined only by the circuit elements $C_s$, $R_{ros}$, $L_{ros}$, $L_{internal}$, $L_{transm}$ (FIG. 6) independently of the pulse repetition frequency, and is typically about 200-400 ns. Practically, 400 kHz is a reasonable choice of the pulse repetition frequency for ion currents up to a few Amps and $C_e$ of several nanofarads (e.g., 7-10 nF); provided that desired sheath voltage, $V_{SH}$, is much larger than $\Delta V_{sh}$ (e.g., $V_{SH}$~3-8 kV, for the above parameters).

It is also clear from the above requirement that it is beneficial to have a large $C_e$, which is why the pulsed voltage biasing scheme proposed herein works most effectively when the pulsed voltage is applied to the chucking pole, rather than to the support base 207 (FIG. 2), to which RF power is usually applied in conventional plasma reactors. Practically, $C_e$ needs to be of the order of several nanofarads for effective implementation of the proposed biasing scheme. For $C_{SH}$~100-300 pF that is typical for high aspect ratio applications, this also automatically implies that $C_e \gg C_{SH}$, which is important for maximizing $V'_{SH}$ at a given $V_{OUT}$.

We note that in the pulsed voltage biasing scheme proposed herein, the voltage switching occurs only inside a nanosecond pulse generator and only at relatively small voltages (e.g., 100-800V) that drive the primary side of the output step-up transformer. This provides a significant practical benefit when compared to previously proposed schemes, in which there is usually a second switch (positioned in place of the resistive output stage) that needs to switch at the full sheath voltage (i.e., at thousands of volts, for example). Presence of the second switch in these previously proposed biasing schemes considerably decreases the system robustness and in practical terms limits their extendibility to sufficiently high sheath voltages (e.g., $V_{SH}$~4000-8000 V) that are required for high aspect ratio applications. The authors were not able to identify commercially available switches capable of switching at RF frequencies (e.g., 400 kHz) and simultaneously high voltages of, e.g., 8,000V. It needs to be mentioned here that the purpose of the blocking diode in FIG. 3 is to prevent the return current from flowing through the secondary winding of the step-up transformer instead of the current-return output stage, during phases 503 and 504.

The authors further note that the current-return output stage 215 may contain a combination of reactive elements, like inductors and capacitors (e.g., series inductor), without limiting its effectiveness in producing a nearly constant sheath voltage. We also note that the value of the resistor (e.g., resistor $R_{ros}$ in FIG. 6) in the current-return output stage needs to be determined based on power balance considerations combined with the requirement of minimizing the RC-discharge time, $t_{stab} \approx R_{ros}(C_s+C_{SH})$, which determines the duration $T_3$ of the sheath formation phase 503. Other benefits of the pulsed voltage biasing scheme proposed herein include commercial availability of the nanosecond pulse generator.

The pulsed voltage biasing scheme proposed herein can also be readily integrated with the high-voltage module (HVM) standardly used for chucking, i.e. "electrically clamping", the substrate to the substrate receiving surface of the ESC substrate support, as shown in FIGS. 2 and 3. Chucking the substrate allows filling a gap between the substrate receiving surface and the non-device side surface of the substrate with helium gas (He), which is done in order to provide good thermal contact between the two and allow substrate temperature control by regulating the temperature of the ESC substrate support. Combining a DC chucking voltage produced by the HVM with the pulsed voltage produced by the pulsed bias generator (such as 240) at a biasing electrode (such as a chucking pole 204) will result in an additional voltage offset of the pulsed voltage waveform (such as 500) equal to the DC chucking voltage. The effect of the HVM on the operation of the pulsed bias generator can be made negligible by selecting appropriately large $C_{hvm}$ and $R_{hvm}$. The main function of the blocking capacitor $C_{hvm}$, in the circuit 300 is to protect the pulsed bias generator from the HVM DC voltage, which thus drops across $C_{hvm}$ and does not perturb the pulsed bias generator output. The value of $C_{hvm}$ needs to be selected such that while blocking only the HVM DC voltage, it does not present any load to the pulsed bias generator's high-frequency output voltage. By selecting a sufficiently large $C_{hvm}$ (e.g., 40-80 nF) we can make it nearly transparent for 400 kHz signal, in that it is much bigger than any other relevant capacitance in the system and the voltage drop across this element is very small compared to that across other relevant capacitors, such as $C_e$, $C_{SH}$. In turn, the purpose of the blocking resistor $R_{hvm}$ is to block the high-frequency pulsed bias generator's voltage and minimize the current it induces in the HVM DC voltage supply. This blocking resistor $R_{hvm}$ needs to be large enough to efficiently minimize the current through it. For example, $R_{hvm}$>1 MOhm is large enough to make the 400 kHz current from the pulsed bias generator into the HVM negligible: $I_{hvm}$~$V_{OUT}/R_{hvm}$ is of the order of 5 mA peak and about 10 times lower when averaged over the waveform period. The resultant average induced current of the order of 0.5-1 mA is indeed much smaller than a typical limitation for HVM power supplies, which is about 5 mA DC current. The above estimates were made for $V_{OUT}$~5 kV, where $V_{OUT}$ (see FIG. 5A) is the positive voltage jump at the chucking pole 204 during the sheath collapse phase 501 and the ESC recharging phase 502, when the switch S1 remains in the closed (On) position and the nanosecond pulse generator 214 maintains a substantially constant positive voltage across its output. Note also, that when selecting $R_{hvm}$, one needs to remember that it cannot be exceedingly large to ensure that $I_{leak}*R_{hvm} \ll V_{hvm}$, which should not be too difficult to satisfy, considering that typical HVM leakage current, $I_{leak}$, is on the order of a few tens of microamps.

Figure 8:
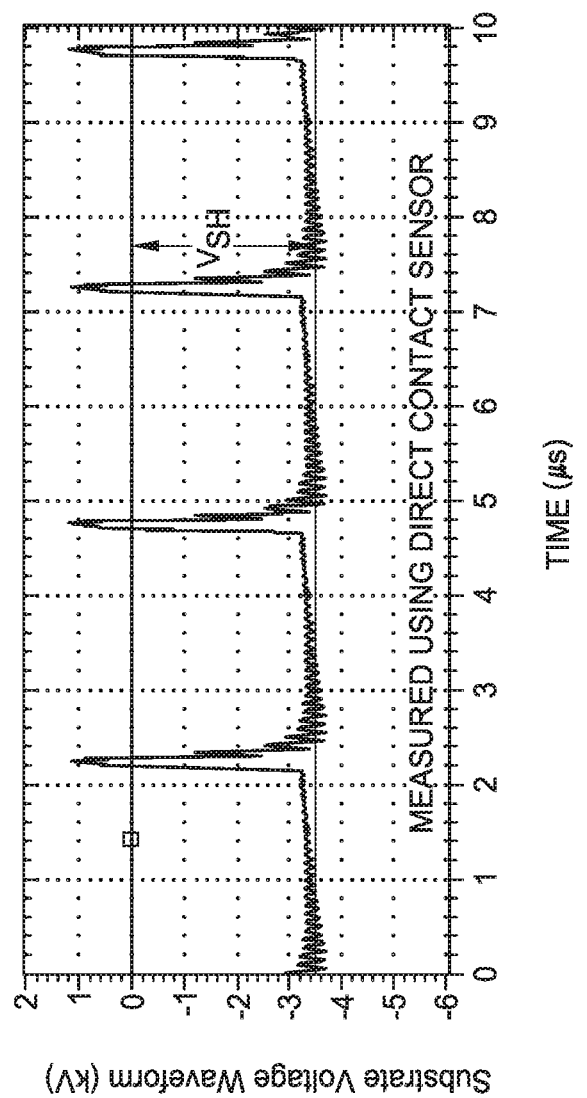
FIG. 8 shows an oscilloscope trace of the measured substrate voltage waveform produced by a practical implementation of the pulsed voltage biasing scheme proposed herein.

FIG. 8 shows an oscilloscope trace of the measured substrate voltage waveform produced by a practical implementation of the pulsed voltage biasing scheme proposed herein. Measurements were performed in predominantly $O_2$ plasma at 10 mT with the ion current to the wafer of about 1.35 A, using a Lecroy PPE4 kV (100:1, 50MΩ/6 pF, 4 kVpp, 400 MHz) high-voltage oscilloscope probe coupled through an electrical (vacuum) feedthrough to a direct contact sensor. The sensor comprised a Kapton™ coated wire dressed in Alumina beads, which was connected to a low-resistivity Silicon wafer using a sufficiently large patch (for good capacitive coupling) of aluminum tape with conductive adhesive; the connection site was further covered by a Kapton™ tape and alumina paste. This diagnostic was bench-tested using a test signal from a function generator, and the substrate potential measurements were also independently verified using an aluminum wafer. As can be seen from FIG. 8, the experimentally observed substrate voltage waveform is in a good agreement with the model-generated waveform shown in FIG. 7E. A good agreement between the model and experiment was also observed for an oscilloscope trace (not shown) of a plasma potential measured near the chamber lid using a floating Langmuir probe similarly coupled to a Lecroy PPE4 kV probe through an electrical (vacuum) feedthrough. Namely, the measured waveform shows that the plasma potential relaxes to almost zero by the beginning of the ion current phase 504. These measurements demonstrate that a pulsed voltage biasing scheme proposed herein can indeed be used to generate a nearly constant sheath (substrate) voltage for up to 90% of the substrate processing time, which in turn results in a narrow single-peak IEDF (i.e., IEDF 520 in FIG. 5C) that can be used to create an IEDF with an arbitrary shape.

B. Detailed Description of FIG. 2: The Chamber Diagram

FIG. 2 is a schematic cross-sectional view of a processing chamber configured to practice the biasing schemes proposed herein, according to one embodiment. In this embodiment, the processing chamber is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. Herein, the processing chamber includes an inductively coupled plasma (ICP) source electrically coupled to a radio frequency (RF) power supply. In other embodiments, the plasma source is a capacitively coupled plasma (CCP) source, such as a source electrode disposed in the processing volume facing the substrate support, wherein the source electrode is electrically coupled to an RF power supply.

The processing chamber 200 features a chamber body 213 which includes a chamber lid 223, one or more sidewalls 222, and a chamber base 224 which define a processing volume 226. A gas inlet 228 disposed through the chamber lid 223 is used to provide one or more processing gases to the processing volume 226 from a processing gas source 219 in fluid communication therewith. Herein, a plasma generator configured to ignite and maintain a processing plasma 201 from the processing gases includes one or more inductive coils 217 disposed proximate to the chamber lid 223 outside of the processing volume 226. The one or more inductive coils 217 are electrically coupled to an RF power supply 218 via an RF matching circuit 230. The plasma generator is used to ignite and maintain a plasma 201 using the processing gases and electromagnetic field generated by the inductive coils 217 and RF power supply 218. The processing volume 226 is fluidly coupled to one or more dedicated vacuum pumps, through a vacuum outlet 220, which maintain the processing volume 226 at sub-atmospheric conditions and evacuate processing, and/or other gases, therefrom. A substrate support assembly 236, disposed in the processing volume 226, is disposed on a support shaft 238 sealingly extending through the chamber base 224.

The substrate 203 is loaded into, and removed from, the processing volume 226 through an opening (not shown) in one of the one or more sidewalls 222, which is sealed with a door or a valve (not shown) during plasma processing of the substrate 203. Herein, the substrate 203 is transferred to and from a receiving surface of an ESC substrate support 205 using a lift pin system (not shown).

The substrate support assembly 236 includes a support base 207 and the ESC substrate support 205 that is thermally coupled to, and disposed on, the support base 207. Typically, the support base 207 is used to regulate the temperature of the ESC substrate support 205, and the substrate 203 disposed on the ESC substrate support 205, during substrate processing. In some embodiments, the support base 207 includes one or more cooling channels (not shown) disposed therein that are fluidly coupled to, and in fluid communication with, a coolant source (not shown), such as a refrigerant source or water source having relatively high electrical resistance. In some embodiments, the ESC substrate support 205 includes a heater (not shown), such as a resistive heating element embedded in the dielectric material thereof. Herein, the support base 207 is formed of a corrosion resistant thermally conductive material, such as a corrosion resistant metal, for example aluminum, aluminum alloy, or stainless steel and is coupled to the substrate support with an adhesive or by mechanical means. Typically, the ESC substrate support 205 is formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the ESC substrate support 205 further includes a biasing electrode 204 embedded in the dielectric material thereof. In one configuration, the biasing electrode 204 is a chucking pole used to secure (chuck) the substrate 203 to a supporting surface of the ESC substrate support 205 and to bias the substrate 203 with respect to the processing plasma 201 using a pulsed-voltage biasing scheme described herein. Typically, the biasing electrode 204 is formed of one or more electrically conductive parts, such as one or more metal meshes, foils, plates, or combinations thereof. Herein, the biasing electrode 204 is electrically coupled to a high voltage module 216 which provides a chucking voltage thereto, such as static DC voltage between about −5000 V and about 5000 V, using an electrical conductor, such as the coaxial transmission line 206, e.g., a coaxial cable.

The support base 207 is electrically isolated from the chamber base 224 by an insulator plate 211, and a ground plate 212 is interposed between the insulator plate 211 and the chamber base 224. In some embodiments, the processing chamber 200 further includes a quartz pipe 210, or collar, circumscribing the substrate support assembly 236 to prevent corrosion of the ESC substrate support 205 and, or, the support base 207 from contact with corrosive processing gases or plasma, cleaning gases or plasma, or byproducts thereof. Typically, the quartz pipe 210, the insulator plate 211, and the ground plate are circumscribed by a liner 208. Herein, a plasma screen 209 approximately coplanar with the substrate receiving surface of the ESC substrate support 205 prevents plasma from forming in a volume between the liner 208 and the one or more sidewalls 222.

Herein, the biasing electrode 204 is spaced apart from the substrate receiving surface of the ESC substrate support 205, and thus from the substrate 203, by a layer of dielectric material of the ESC substrate support 205. Typically, the layer of dielectric material has a thickness between about 0.1 mm and about 1 mm, such as between about 0.1 mm and about 0.5 mm, for example about 0.3 mm. Herein, the biasing electrode 204 is electrically coupled to the pulsed bias generator 240 using the external conductor, such as the transmission line 206. The pulsed bias generator 240 and the components thereof are described in detail earlier in the text of this disclosure. As noted above, the dielectric material and layer thickness can be selected so that the capacitance $C_e$ of the layer of dielectric material is between about 5 nF and about 12 nF, such as between about 7 and about 10 nF, for example.

Generally, a low neutral fill pressure in the processing volume 226 of the processing chamber 200 results in poor thermal conduction between surfaces disposed therein, such as between the dielectric material of the ESC substrate support 205 and the substrate 203 disposed on the substrate receiving surface thereof, which reduces the ESC substrate support's 205 effectiveness in heating or cooling the substrate 203. Therefore, in some processes, a thermally conductive inert heat transfer gas, typically helium, is introduced into a volume (not shown) disposed between a non-device side surface of the substrate 203 and the substrate receiving surface of the ESC substrate support 205 to improve the heat transfer therebetween. The heat transfer gas, provided by a heat transfer gas source (not shown), flows to the backside volume through a gas communication path (not shown) disposed through the support base 207 and further disposed through the ESC substrate support 205.

The processing chamber 200 further includes a system controller 232. The system controller 232 herein includes a central processing unit (CPU) 233, a memory 234, and support circuits 235. The system controller 232 is used to control the process sequence used to process the substrate 203 including the substrate biasing methods described herein. The CPU 233 is a general purpose computer processor configured for use in an industrial setting for controlling processing chamber and sub-processors related thereto. The memory 234 described herein may include random access memory, read only memory, floppy or hard disk drive, or other suitable forms of digital storage, local or remote. The support circuits 235 are conventionally coupled to the CPU 233 and comprise cache, clock circuits, input/output subsystems, power supplies, and the like, and combinations thereof. Software instructions and data can be coded and stored within the memory 234 for instructing a processor within the CPU 233. A program (or computer instructions) readable by the system controller 232 determines which tasks are performable by the components in the processing chamber 200. Preferably, the program, which is readable by the system controller 232, includes code, which when executed by the processor, perform tasks relating to the monitoring and execution of the electrode biasing scheme described herein. The program will include instructions that are used to control the various hardware and electrical components within the processing chamber 200 to perform the various process tasks and various process sequences used to implement the electrode biasing scheme described herein.

While the foregoing is directed to embodiments of the present disclosure, other and further embodiments of the disclosure may be devised without departing from the basic scope thereof, and the scope thereof is determined by the claims that follow.

The invention claimed is:

1. A method of processing of a substrate, comprising:
generating a plasma over a surface of a substrate disposed on a substrate support assembly; and
biasing a biasing electrode disposed within the substrate support assembly using a bias generator that is electrically coupled to a generator end of an electrical conductor using a generator coupling assembly, an electrode end of the electrical conductor is electrically coupled to the biasing electrode using an electrode coupling assembly, the bias generator is configured to establish a pulsed voltage waveform at the biasing electrode, and the pulsed voltage waveform comprises a series of repeating cycles,
wherein a waveform within each cycle of the series of repeating cycles has a first portion that occurs during a first time interval and a second portion that occurs during a second time interval,
wherein a positive voltage pulse is only present during the first time interval,
wherein the bias generator comprises:
a pulse generator that is electrically coupled to the generator end of the electrical conductor; and
a current-return output stage, wherein
a first end of the current-return output stage is electrically coupled to the electrical conductor, and
a second end of the current-return output stage is electrically coupled to the ground, and
wherein a current flows from the biasing electrode to ground through the current-return output stage during at least a portion of the second time interval.

2. The method of claim 1, wherein
the first portion of the waveform further comprises a positive voltage pulse resulting in restoration of a sheath voltage drop, wherein a sheath is formed over a plasma facing surface of the substrate at the end of the first time interval.

3. The method of claim 1, wherein the first time interval has a time duration of between about 200 ns and about 400 ns.

4. The method of claim 3, wherein the cycle of the series of repeating cycles has a time duration of between about 2 microseconds (μs) and about 3 μs.

5. The method of claim 1, wherein the first time interval is less than about 20% of a time duration of a cycle of the series of repeating cycles.

6. The method of claim 1, wherein the positive voltage pulse is between about 0.1 kilovolts (kV) and about 10 kV.

7. The method of claim 1, wherein the biasing electrode is spaced apart from a substrate supporting surface of the substrate support assembly by a layer of the dielectric material, and wherein a parallel plate like structure comprising the biasing electrode and the layer of the dielectric material has an effective capacitance of between about 5 nF and about 50 nF.

8. The method of claim 1, further comprising:
applying a DC voltage to the biasing electrode using a chucking power supply that is electrically coupled to the generator end of the electrical conductor using a supply coupling assembly.

9. The method of claim 8, wherein the supply coupling assembly comprises a blocking resistor having a resistance more than about 1 MOhm.

10. The method of claim 1, wherein the electrical conductor further comprises a first electrical conductor and a second electrical conductor that are electrically coupled in series, wherein one end of the first electrical conductor is electrically coupled to an output of the bias generator and one end of the second electrical conductor is electrically coupled to the biasing electrode.

11. The method of claim 1, wherein a first end of the pulse generator is electrically coupled to the generator end of the electrical conductor, and a second end of the pulse generator is electrically coupled to ground.

12. The method of claim 1, wherein the generator coupling assembly comprises one of the components selected from the group consisting of a capacitor, a capacitor and an electrical conductor in series, an inductor, and an inductor and an electrical conductor in series.

13. The method of claim 1, wherein the electrode coupling assembly comprises one of the components selected from the group consisting of a capacitor, a capacitor and an electrical conductor in series, an inductor, and an inductor and an electrical conductor in series.

14. The method of claim 1, wherein the generator coupling assembly comprises a capacitor having a capacitance in a range of about 40 nF to about 80 nF.

15. A processing chamber, comprising:
a substrate support assembly comprising a biasing electrode that is separated from a substrate supporting surface of the substrate support assembly by a layer of a dielectric material; and
a bias generator that is electrically coupled to a generator end of an electrical conductor using a generator coupling assembly, and an electrode end of the electrical conductor is electrically coupled to the biasing electrode using an electrode coupling assembly,
wherein the bias generator comprises:
a pulse generator that is electrically coupled to the generator end of the electrical conductor; and
a current-return output stage, wherein
a first end of the current-return output stage is electrically coupled to the electrical conductor, and
a second end of the current-return output stage is electrically coupled to the ground, and
wherein the electrical conductor comprises a first electrical conductor and a second electrical conductor that are electrically coupled in series, and wherein one end of the first electrical conductor is electrically coupled to an output of the bias generator using the generator coupling assembly and one end of the second electrical conductor is electrically coupled to the biasing electrode using the electrode coupling assembly.

16. The processing chamber of claim 15, further comprising:
an inductively coupled plasma source or a capacitively coupled plasma source that is configured to generate a plasma over the substrate supporting surface of the substrate support assembly, and
the voltage source of the pulse generator comprises a substantially constant voltage source.

17. The processing chamber of claim 15, further comprising:
a chucking power supply that is electrically coupled to the generator end of the electrical conductor using a supply coupling assembly.

18. The processing chamber of claim 17, wherein the supply coupling assembly comprises a blocking resistor that has a resistance of more than about 1 MOhm.

19. The processing chamber of claim 15, wherein a parallel plate like structure comprising the biasing electrode and the layer of the dielectric material has an effective capacitance of between about 5 nF and about 50 nF.

20. The processing chamber of claim 15, wherein dielectric material layer has a thickness between about 0.1 mm and about 1 mm.

21. The processing chamber of claim 15, wherein a first end of the pulse generator is electrically coupled to the generator end of the electrical conductor, and a second end of the pulse generator is electrically coupled to ground.

22. The processing chamber of claim 15, wherein the generator coupling assembly comprises one of the components selected from the group consisting of a capacitor, a capacitor and an electrical conductor in series, an inductor, and an inductor and an electrical conductor in series.

23. The processing chamber of claim 15, wherein the electrode coupling assembly comprises one of the components selected from the group consisting of a capacitor, a capacitor and an electrical conductor in series, an inductor, and an inductor and an electrical conductor in series.

24. A processing chamber, comprising:
a substrate support assembly comprising a biasing electrode that is separated from a substrate supporting surface of the substrate support assembly by a layer of a dielectric material;
a bias generator that is electrically coupled to a generator end of an electrical conductor using a generator coupling assembly, and an electrode end of the electrical conductor is electrically coupled to the biasing electrode using an electrode coupling assembly, wherein the bias generator comprises:
a pulse generator that is electrically coupled to the generator end of the electrical conductor; and
a current-return output stage, wherein
a first end of the current-return output stage is electrically coupled to the electrical conductor, and
a second end of the current-return output stage is electrically coupled to the ground; and
a non-transitory computer readable medium having instructions stored thereon for performing a method of processing a substrate when executed by a processor, the method comprising:
generating a plasma over a surface of a substrate disposed on the substrate support assembly; and
biasing the biasing electrode using the bias generator, wherein biasing the biasing electrode establishes a pulsed voltage waveform at the biasing electrode, and
wherein
the pulsed voltage waveform comprises a series of repeating cycles,
a waveform within each cycle of the series of repeating cycles has a first portion that occurs during a first time interval and a second portion that occurs during a second time interval, and
a positive voltage pulse is only present during the first time interval,
wherein the electrical conductor comprises a first electrical conductor and a second electrical conductor that are electrically coupled in series, and wherein one end of the first electrical conductor is electrically coupled to an output of the bias generator using the generator coupling assembly and one end of the second electrical conductor is electrically coupled to the biasing electrode using the electrode coupling assembly.

25. The processing chamber of claim 24, wherein
the positive voltage pulse results in restoration of a sheath voltage drop formed over a plasma facing surface of the substrate at the end of the first time interval, and
a current flows from the biasing electrode to ground through the current-return output stage during at least a portion of the second time interval.

26. The processing chamber of claim 24, wherein first time interval has a duration of between about 200 ns and about 400 ns.

27. The processing chamber of claim 24, wherein the first time interval is less than about 20% of a time duration of a cycle of the series of repeating cycles.

28. The processing chamber of claim 24, wherein the cycle of the series of repeating cycles has a period that has a duration of between about 2 µs and about 3 µs.

29. The processing chamber of claim 24, wherein a first end of the pulse generator is electrically coupled to the generator end of the electrical conductor, and a second end of the pulse generator is electrically coupled to ground.

30. The processing chamber of claim 24, wherein the generator coupling assembly comprises one of the components selected from the group consisting of a capacitor, a capacitor and an electrical conductor in series, an inductor, and an inductor and an electrical conductor in series.

31. The processing chamber of claim 24, wherein the electrode coupling assembly comprises one of the components selected from the group consisting of a capacitor, a capacitor and an electrical conductor in series, an inductor, and an inductor and an electrical conductor in series.

32. The processing chamber of claim 24, wherein the generator coupling assembly comprises a capacitor having a capacitance in a range of about 40 nF to about 80 nF.

* * * * *